US012726181B2

(12) United States Patent
Yu et al.

(10) Patent No.: US 12,726,181 B2
(45) Date of Patent: Sep. 1, 2026

(54) CLOCK GENERATION CIRCUITS AND METHODS OF GENERATING CLOCK SIGNALS

(71) Applicant: Samsung Electronics Co., Ltd., Suwon-si (KR)

(72) Inventors: Wonsik Yu, Anyang-si (KR); Wooseok Kim, Suwon-si (KR); Taeik Kim, Seongnam-si (KR); Chanyoung Jeong, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 1399 days.

(21) Appl. No.: 17/466,006

(22) Filed: Sep. 3, 2021

(65) Prior Publication Data

US 2022/0239284 A1 Jul. 28, 2022

(30) Foreign Application Priority Data

Jan. 22, 2021 (KR) ........................ 10-2021-0009391

(51) Int. Cl.
*H03K 3/011* (2006.01)
*G06F 1/08* (2006.01)
(Continued)

(52) U.S. Cl.
CPC ............... *H03K 3/011* (2013.01); *G06F 1/08* (2013.01); *G06F 1/12* (2013.01); *H03K 3/037* (2013.01)

(58) Field of Classification Search
CPC .......... H03K 3/011; H03K 3/037; H03K 3/02; H03K 2005/00143; H03K 19/20;
(Continued)

(56) References Cited

U.S. PATENT DOCUMENTS 5,994,970 A 11/1999 Cole et al.
6,020,792 A 2/2000 Nolan et al.
(Continued)

FOREIGN PATENT DOCUMENTS

CN 104185274 A 12/2014
KR 20100114350 A 10/2010
(Continued)

OTHER PUBLICATIONS

Office Action dated Mar. 11, 2025 from the Korean Intellectual Property Office (KIPO) for Korean Patent Application No. 10-2021-0009391.

(Continued)

*Primary Examiner* — Taelor Kim
*Assistant Examiner* — James G Yeaman
(74) *Attorney, Agent, or Firm* — Wolf, Greenfield & Sacks, P.C.

(57) ABSTRACT

A clock generation circuit includes a temperature compensation circuit and an oscillator. The temperature compensation circuit is configured to generate a temperature-compensated frequency selection code that varies depending on an operation temperature based on a difference between the operation temperature and a reference temperature and based on a temperature-independent frequency selection code that is fixed regardless of the operation temperature. The oscillator is configured to generate a clock signal that has an operation frequency that is based on the temperature-compensated frequency selection code, such that the operation frequency is uniform regardless of the operation temperature. Effects of the operation temperature may be reduced by generating the temperature-compensated frequency selection code that reflects the temperature characteristic of the oscillator using the output value of the (Continued)

temperature sensor and by controlling the oscillator using the temperature-compensated frequency selection code.

20 Claims, 15 Drawing Sheets

(51) Int. Cl.
*G06F 1/12* (2006.01)
*H03K 3/037* (2006.01)

(58) Field of Classification Search
CPC .... G06F 1/08; G06F 1/12; H03B 5/04; H03L 7/18; H03L 1/027; G11C 7/222
See application file for complete search history.

(56) References Cited

U.S. PATENT DOCUMENTS

| | | | |
|---|---|---|---|
| 6,271,736 | B1 | 8/2001 | Kim |
| 6,917,249 | B1 | 7/2005 | Kuo et al. |
| 7,102,452 | B1 | 9/2006 | Holmes |
| 7,639,086 | B2 | 12/2009 | Lee et al. |
| 7,978,017 | B2 | 7/2011 | Pernia et al. |
| 8,248,877 | B2 | 8/2012 | Kim |
| 8,363,774 | B2 | 1/2013 | Lin et al. |
| 9,276,584 | B2 * | 3/2016 | Au Yeung ............... H03L 1/021 |
| 9,325,276 | B2 | 4/2016 | Huynh et al. |
| 9,602,110 | B1 | 3/2017 | Caffee |
| 9,672,893 | B2 | 6/2017 | Jung et al. |
| 10,115,702 | B2 | 10/2018 | Yu et al. |
| 10,812,090 | B2 * | 10/2020 | Mussi ................ H03K 5/00006 |
| 2009/0108949 | A1 | 4/2009 | Yan et al. |
| 2011/0216660 | A1 | 9/2011 | Lee et al. |
| 2011/0319084 | A1 | 12/2011 | Meshkati et al. |
| 2012/0252503 | A1 | 10/2012 | Wu |
| 2013/0089030 | A1 | 4/2013 | Yu |
| 2015/0070211 | A1 | 3/2015 | Cheng et al. |
| 2016/0070294 | A1 * | 3/2016 | Chung ..................... G09G 5/12 331/8 |
| 2016/0330709 | A1 | 11/2016 | Li |

FOREIGN PATENT DOCUMENTS

| | | | |
|---|---|---|---|
| KR | 10-2016-0029593 | A | 3/2016 |
| WO | 2012148321 | A1 | 11/2012 |
| WO | 2015105363 | A1 | 7/2015 |
| WO | 2015109528 | A1 | 7/2015 |

OTHER PUBLICATIONS

Ding, Ming, “A 0.9pJ/cycle 8ppm/0 DFLL-Based Wakeup Timer Enable by a Time Domain Trimming and an Embedded Temperature Sensing,” IEEE Jun. 2020.

“Canadian Patent Appl. No. 3,010,312, Office Action, May 29, 2020”.

“Extended European Search Report, Application No. 15912193.8, Jul. 5, 2019”.

“J.W. Yoon, et al., “Wireless network Synchronization Algorithm Based on IEEE 802.11 WLANs (Wireless Local Area Networks) for Multimedia Services,” Journal of the Korea Society of Computer and Information (vol. 13, issue ), pp. 225-232, Nov. 30, 2008”, [in Korean; machine translation attached].

“Office Action for corresponding European Application No. 15912193.8-1205, dated Apr. 30, 2021, 5 pages”.

“Office Action, corresponding to Canadian Application No. 3,010,31, dated Feb. 26, 2021, 5 pgs”.

“PCT International Preliminary Report on Patentability and Written Opinion, Re: Application No. PCT/US2015/068186, Sep. 28, 2016”.

* cited by examiner

FIG. 1

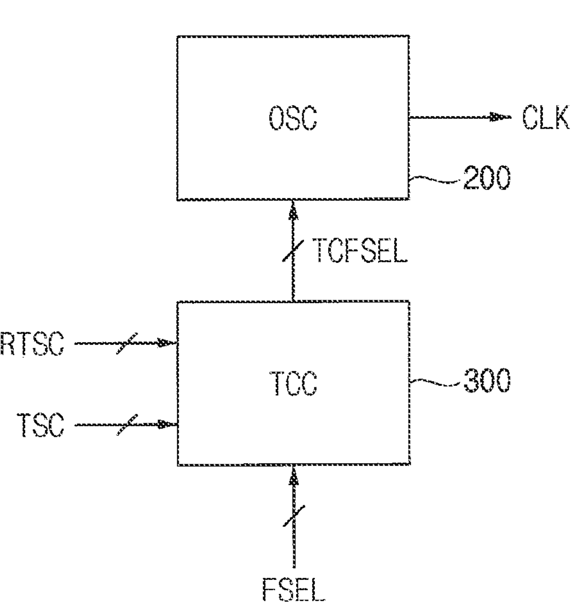

FIG. 2

GENERATE A TEMPERATURE-COMPENSATED FREQUENCY SELECTION CODE THAT IS CHANGED DEPENDING ON AN OPERATION TEMPERATURE BY CORRECTING A FREQUENCY SELECTION CODE BASED ON A DIFFERENCE BETWEEN THE OPERATION TEMPERATURE AND A REFERENCE TEMPERATURE, THE FREQUENCY SELECTION CODE BEING FIXED REGARDLESS OF THE OPERATION TEMPERATURE — S100

GENERATE A CLOCK SIGNAL HAVING AN OPERATION FREQUENCY BASED ON THE TEMPERATURE-COMPENSATED FREQUENCY SELECTION CODE SUCH THAT THE OPERATION FREQUENCY IS UNIFORM REGARDLESS OF THE OPERATION TEMPERATURE — S200

END

FIG. 3
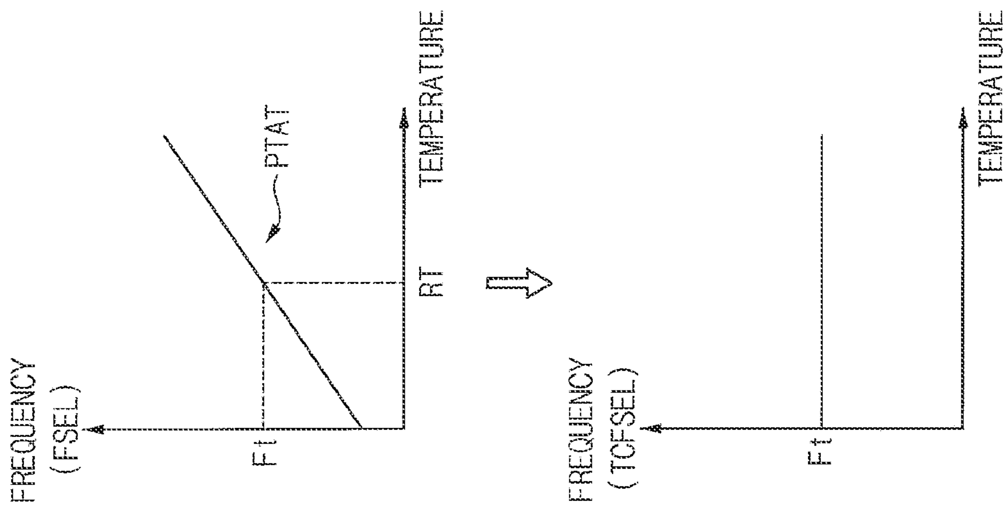
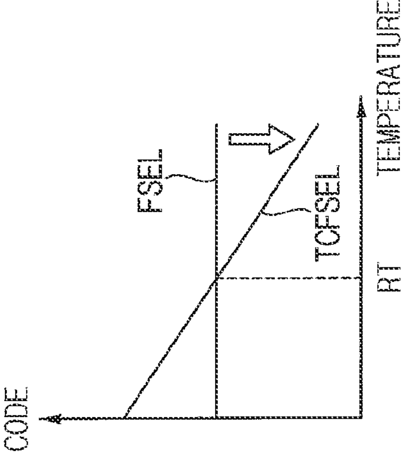
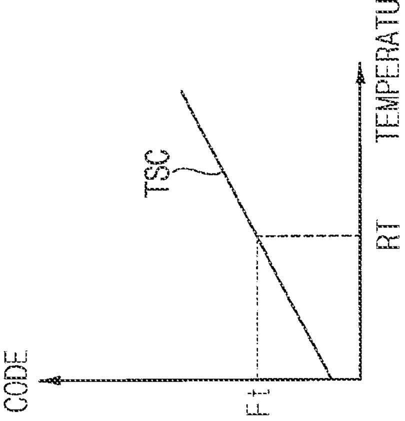

FIG. 4
FREQUENCY (FSEL)
Ft
CTAT
RT
TEMPERATURE
FREQUENCY (TCFSEL)
Ft
TEMPERATURE
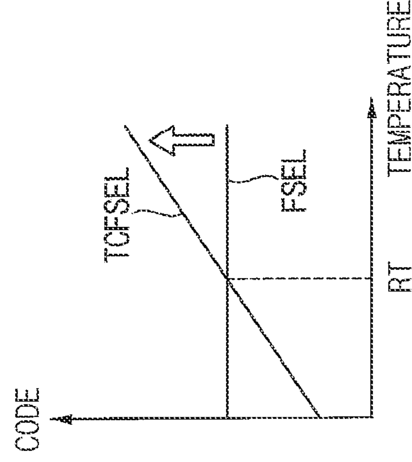
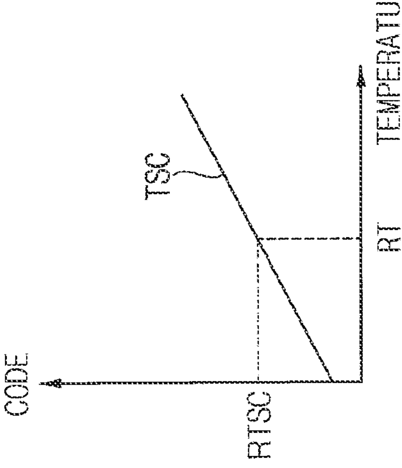

200
CLK
CLKB
Q
QB
LATCH
S
R
250
Vcmp1
Vcmp2
COM1
COM2
240
VA
Vref
VB
CLKB
MP2
MN2
VB
C2
232
230
220
TCFSEL
Ichg
N2
MP1
MN1
VA
C1
231
VREG
NP1
Vref
CLK
NP2
VSS
210
MP0
N1
Iref
Rref

| TCFSEL[2:0] | TMC[7:1] |
|---|---|
| 0 0 0 | 0 0 0 0 0 0 0 |
| 0 0 1 | 0 0 0 0 0 0 1 |
| 0 1 0 | 0 0 0 0 0 1 1 |
| 0 1 1 | 0 0 0 0 1 1 1 |
| 1 0 0 | 0 0 0 1 1 1 1 |
| 1 0 1 | 0 0 1 1 1 1 1 |
| 1 1 0 | 0 1 1 1 1 1 1 |
| 1 1 1 | 1 1 1 1 1 1 1 |

350

CLOCK GENERATION CIRCUITS AND METHODS OF GENERATING CLOCK SIGNALS

CROSS-REFERENCE TO RELATED APPLICATION

This U.S. non-provisional application claims priority under 35 U.S.C. § 119 to Korean Patent Application No. 10-2021-0009391, filed on Jan. 22, 2021, in the Korean Intellectual Property Office (KIPO), the disclosure of which is incorporated by reference herein in its entirety.

BACKGROUND

1. Technical Field

The present disclosure relates generally to semiconductor integrated circuits, and more particularly to clock generation circuits and to methods of generating clock signals.

2. Discussion of the Related Art

Market demand is continually increasing for improved semiconductor integrated circuits, such as those with improved picture quality, resolution, multi-functionality, and/or faster operation speeds. A semiconductor device may operate at various frequencies for driving internal circuits. An oscillator may be used to generate clock signals for at least one of the internal circuits. The clock signal frequency generated for any one internal circuit may adversely affect operation of one or more other internal circuits. There is an increasing interest or expectation in providing a clock signal having a uniform or more uniform frequency, regardless of variations in manufacturing processes, operation voltages, and/or temperatures.

SUMMARY

Some example embodiments may provide clock generation circuits and methods of generating clock signals that are capable of reducing effects of operation temperatures and/or variations in operation temperatures.

According to some example embodiments, a clock generation circuit may include a temperature compensation circuit and an oscillator. The temperature compensation circuit may be configured to generate a temperature-compensated frequency selection code that varies depending on an operation temperature. The temperature-compensated frequency selection code may be generated based on a difference between the operation temperature and a reference temperature, and based on a temperature-independent frequency selection code that is fixed regardless of the operation temperature. The oscillator may be configured to generate a clock signal that has an operation frequency that is based on the temperature-compensated frequency selection code, such that the operation frequency is uniform regardless of the operation temperature.

According to some example embodiments, a clock generation circuit may include a temperature compensation circuit that is configured to generate a temperature-compensated frequency selection code that varies depending on an operation temperature, and an oscillator that is configured to generate a clock signal that has an operation frequency that is based on the temperature-compensated frequency selection code. such that the operation frequency is uniform regardless of the operation temperature. The temperature compensation circuit may include a clock divider configured to generate a divided clock signal by dividing a frequency of the clock signal, a logic circuit configured to generate a correction code based on the difference between the operation temperature and the reference temperature, and an output circuit configured to generate the temperature-compensated frequency selection code by summing the correction code and a temperature-independent frequency selection code that is fixed regardless of the operation temperature.

According to some example embodiments, a method of generating a clock signal, includes, generating a temperature-compensated frequency selection code that varies depending on an operation temperature, based on a temperature-independent frequency selection code and based on a difference between the operation temperature and a reference temperature, and generating a clock signal that has an operation frequency that is based on the temperature-compensated frequency selection code, such that the operation frequency is uniform regardless of the operation temperature.

The clock generation circuits and the methods of generating clock signals according to some example embodiments may reduce in an efficient manner effects of the operation temperature by generating the temperature-compensated frequency selection code that reflects the temperature characteristic of the oscillator using the output value of the temperature sensor and by controlling the oscillator using the temperature-compensated frequency selection code.

BRIEF DESCRIPTION OF THE DRAWINGS

Example embodiments of the present disclosure will be more clearly understood from the following detailed description taken in conjunction with the accompanying drawings.

FIG. 1 is a block diagram illustrating a clock generation circuit according to some example embodiments.

FIG. 2 is a flow chart illustrating a method of generating a clock signal according to some example embodiments.

FIGS. 3 and 4 are diagrams illustrating operations depending on temperature characteristics of a clock generation circuit according to some example embodiments.

DETAILED DESCRIPTION OF THE EMBODIMENTS

Figure 5:
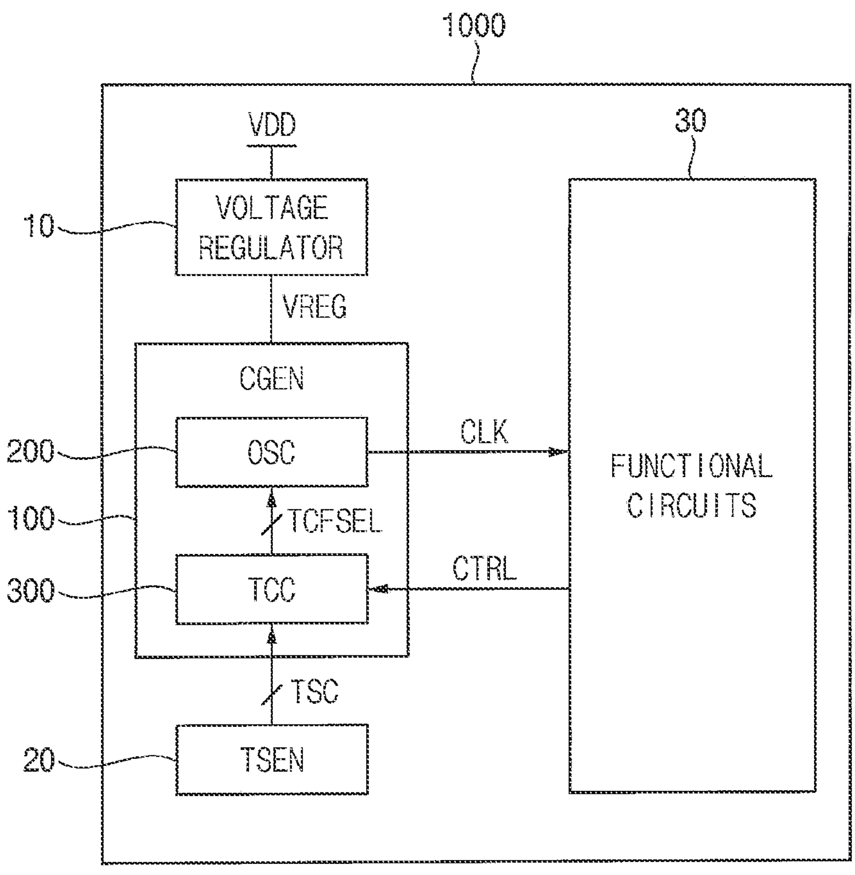
FIG. 5 is a block diagram illustrating a semiconductor integrated circuit according to some example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a block diagram illustrating a clock generation circuit according to some example embodiments, and FIG. 2 is a flow chart illustrating a method of generating a clock signal according to some example embodiments.

Referring to FIG. 1, a clock generation circuit 100 includes an oscillator OSC 200 and a temperature compensation circuit TCC 300. The clock generation circuit 100 may be integrated into a semiconductor integrated circuit (not shown).

Referring to FIG. 2 together with FIG. 1, the temperature compensation circuit 300 may generate a temperature-compensated frequency selection code TCFSEL that varies depending on an operation temperature by correcting a frequency selection code FSEL. The temperature-compensated frequency selection code TCFSEL may be based on a difference between the operation temperature and a reference temperature and the frequency selection code FSEL, which may be a temperature-independent frequency selection code FSEL that is fixed regardless of the operation temperature (S100).

The temperature compensation circuit 300 may receive a reference temperature code RTSC that corresponds to the reference temperature and an operation temperature code TSC that corresponds to the operation temperature, and may determine the difference between the operation temperature and the reference temperature. The reference temperature code RTSC may be determined through a test operation of the semiconductor integrated circuit in which the clock generation circuit 100 is integrated. The reference temperature code RTSC may be stored in a nonvolatile memory device (not shown) included in the semiconductor integrated circuit and the reference temperature code RTSC may be loaded from the nonvolatile memory device to the temperature compensation circuit 300. The reference temperature code RTSC may be provided to the temperature compensation circuit 300 as a form of digital data or as a digital signal. In some example embodiments, the reference temperature may be a room temperature of about 25° C.

The operation temperature code TSC may be provided from a temperature sensor included in the semiconductor integrated circuit. The temperature sensor may include an analog-to-digital converter that is configured to provide to the temperature compensation circuit 300 the operation temperature code TSC as a form of digital data or as a digital signal having multiple bits.

The oscillator 200 may generate a clock signal CLK that has an operation frequency based on the temperature-compensated frequency selection code TCFSEL, such that the operation frequency is uniform regardless of the operation temperature (S200).

In general, the oscillator 200 may have a particular temperature characteristic. For example, the oscillator 200 may have a proportional to absolute temperature (PTAT) characteristic, or the oscillator 200 may have a complementary to absolute temperature (CTAT) characteristic. The temperature compensation circuit 300 may be configured to generate the temperature-compensated frequency selection code TCFSEL that is varied in a direction so as to counterbalance the temperature characteristic of the oscillator 200. The operations of the temperature compensation circuit 300 and the oscillator 200 according to the temperature characteristic will be described in greater detail with reference to FIGS. 3 and 4.

As such, the clock generation circuit 100 and the method of generating the clock signal CLK according to some example embodiments may reduce effects of the operation temperature by generating the temperature-compensated frequency selection code TCFSEL reflecting the temperature characteristic of the oscillator 200 using the output value of the temperature sensor, and by controlling the oscillator 200 using the temperature-compensated frequency selection code TCFSEL.

FIGS. 3 and 4 are diagrams illustrating operations depending on temperature characteristics of a clock generation circuit according to example embodiments.

As illustrated in FIGS. 3 and 4, the operation temperature code TSC provided from the temperature sensor may have a value that increases linearly as the operation temperature increases. According to some example embodiments, the value of the operation temperature code TSC may decrease or increase linearly or non-linearly as the operation temperature increases.

The reference temperature code RTSC may be determined through a test operation of the semiconductor integrated circuit in which the clock generation circuit is integrated. In addition, the frequency selection code FSEL may be determined through a test operation (e.g., the same test operation), such that the clock signal CLK may have a target frequency Ft at the reference temperature RT.

FIG. 3 shows diagrams illustrating operations that correspond to the oscillator 200 having the PTAT characteristic. In this case, the oscillator 200 may generate the clock signal CLK having the frequency increasing as the operation temperature increases if the frequency selection code FSEL having the fixed value regardless of the operation temperature is applied to the oscillator 200.

As illustrated in FIG. 3, when the oscillator 200 has the PTAT characteristic the temperature compensation circuit 300 may decrease the value of the temperature-compensated frequency selection code TCFSEL as the operation temperature increases. In other words, the temperature compensation circuit 300 may generate the temperature-compensated frequency selection code TCFSEL that has the CTAT characteristic.

The PTAT characteristic of the oscillator 200 may be counterbalanced by applying the temperature-compensated frequency selection code TCFSEL having the CTAT characteristic to the oscillator 200, such that the frequency of the clock signal CLK may be maintained uniformly or more uniformly regardless of the operation temperature. In other words, the frequency of the clock signal CLK may maintain or more closely maintain the target frequency Ft.

FIG. 4 shows diagrams illustrating operations that correspond to the oscillator 200 having the CTAT characteristic. In this case, the oscillator 200 may generate the clock signal CLK that has a frequency that decreases as the operation temperature increases if the frequency selection code FSEL having the fixed value regardless of the operation temperature is applied to the oscillator 200.

As illustrated in FIG. 4, when the oscillator 200 has the CTAT characteristic the temperature compensation circuit 300 may increase the value of the temperature-compensated frequency selection code TCFSEL as the operation temperature increases. In other words, the temperature compensation circuit 300 may generate the temperature-compensated frequency selection code TCFSEL having the PTAT characteristic.

The CTAT characteristic of the oscillator 200 may be counterbalanced by applying the temperature-compensated frequency selection code TCFSEL having the PTAT characteristic to the oscillator 200, such that the frequency of the clock signal CLK may be maintained uniformly or more uniformly regardless of the operation temperature. In other words, the frequency of the clock signal CLK may maintain or more closely maintain the target frequency Ft.

In some example embodiments, as will be described below with reference to FIGS. 6 through 9, the oscillator 200 may be a resistor-capacitor (RC) oscillator configured to generate the clock signal CLK through repeated charging and discharging of a capacitor. The RC oscillator may be configured to generate a charging current that is proportional to the temperature-compensated frequency selection code TCFSEL and may charge the capacitor using the charging current. In some example embodiments, the clock generation circuit may further include a thermometer decoder configured to convert the temperature-compensated frequency selection code TCFSEL to a thermometer code. In this case, the oscillator 200 may generate the charging current based on bit values of the thermometer code.

A RC oscillator or an RC relaxation oscillator may be and is used as clock component or intellectual property (IP) in various products that do not use an external crystal oscillator, such as a biomedical device, an internet of things (IoT) sensor hub, a memory controller, or the like. The frequency of the RC oscillator may be adjusted conveniently by adjusting values of passive elements such as a resistor and a capacitor. In addition, effects of variations in a complementary metal oxide semiconductor (CMOS) manufacturing processes and/or variations in power supply voltages may be removed easily through one-point trimming at the room temperature in case of the RC oscillator.

On the other hand, the RC oscillator may be vulnerable to temperature variations. The frequency is basically affected by the resistor included in the RC oscillator. If the resistor has the CTAT characteristic, the oscillator using such a resistor may have the PTAT characteristic, such that the frequency increases as the decrease amount of the temperature variations of the resistor.

When the temperature coefficient of the resistor is great, and/or when the oscillator is used in operation environments of large temperature variation, the frequency of the oscillator may vary a large amount based on the operation temperature, which may affect timing closure of a digital logic using the clock signal and may degrade yield of products.

The conventional schemes are focused on implementing the temperature compensation based on consideration of the characteristics of the elements. In contrast, example embodiments of the present disclosure provide temperature compensation schemes using an output of a temperature sensor that indicates the operation temperature or the operation temperature code TSC.

Most products, such as memory, ASIC, SOC, or the like, include a temperature sensor to detect and/or resolve internal heating issues. The temperature information is digitalized as a code and the operation temperature may be monitored on the fly in a full-chip system. According to some example embodiments of the present disclosure, the clock generation circuit 100 may receive the operation temperature code TSC from a full-chip system that includes the temperature sensor, and the clock generation circuit 100 may generate the clock signal CLK without sensitivity to the temperature variation.

According to some example embodiments, the temperature compensation circuit 300 may generate the temperature-compensated frequency selection code TCFSEL by varying or adjusting the frequency selection code FSEL according to the operation temperature on the basis of the reference temperature. Even though a general RC oscillator is used, the performance of the RC oscillator may be enhanced by replacing the frequency selection code FSEL with the temperature-compensated frequency selection code TCFSEL using the temperature compensation circuit 300. In other words, the frequency of the oscillator 200 may be maintained uniformly or more uniformly by adjusting the value of the temperature-compensated frequency selection code TCFSEL based on the operation temperature.

The clock generation circuit according to example embodiments may be used efficiently in devices, such as memory controllers, that are typically not provided with an external clock source.

In some example embodiments, the temperature compensation circuit 300 may further include a synchronization circuit, a start-up enable circuit, a low-pass filter, etc., as will be described in greater detail herein. Problems occurring in interfacing between other components or IPs may be relieved using such elements.

FIG. 5 is a block diagram illustrating a semiconductor integrated circuit according to some example embodiments.

Referring to FIG. 5, a semiconductor integrated circuit 1000 may include a voltage regulator 10, a clock generation circuit CGEN 100, a temperature sensor TSEN 20 and a plurality of functional circuits (or components or IPs) 30.

The voltage regulator 10 may generate a regulator voltage VREG based on a power supply voltage VDD. The voltage regulator 10 may adopt a low drop out (LDO) scheme to provide the regulator voltage VREG without sensitivity to variation in the power supply voltage VDD.

The temperature sensor 20 may be adjacent to the clock generation circuit 100 and may be configured to measure the operation temperature. The temperature sensor 20 may provide to the clock generation circuit 100 an operation temperature code TSC that corresponds to the operation temperature. The operation temperature code TSC may be provided as a digital data or as a digital signal having multiple bits.

The clock generation circuit 100 may generate the clock signal CLK based on the regulator voltage VREG, the operation temperature code TSC, and a control signal CTRL. The control signal CTRL may be provided from one or more of the plurality of functional circuits 30. The control signal CTRL may include the reference temperature code RTSC and the frequency selection code FSEL as described above. In addition, the control signal CTRL may include a voltage reset signal RSTB, a mode signal MD, weight factor information WFINF, etc. as will be described in greater detail herein.

FIG. 5 illustrates an example in which the clock generation circuit 100 is powered based on the regulator voltage VREG from the voltage regulator 10, but the present disclosure is not limited thereto. In some example embodiments, the clock generation circuit 100 may be powered based on the power supply voltage VDD instead of the regulator voltage VREG.

The clock generation circuit 100 may include an oscillator OSC 200 and a temperature compensation circuit TCC 300. As described above, the temperature compensation circuit 300 may be configured generate the temperature-compensated frequency selection code TCFSEL that varies depending on the operation temperature. The temperature-compensated frequency selection code TCFSEL may be generated based on the difference between the operation temperature and the reference temperature and based on the frequency selection code FSEL, which may be a temperature-independent frequency selection code that is fixed regardless of the operation temperature. The oscillator 200 may generate the clock signal CLK that has an operation frequency that is based on the temperature-compensated frequency selection code TCFSEL, such that the operation frequency is uniform regardless of the operation temperature.

Figure 6:
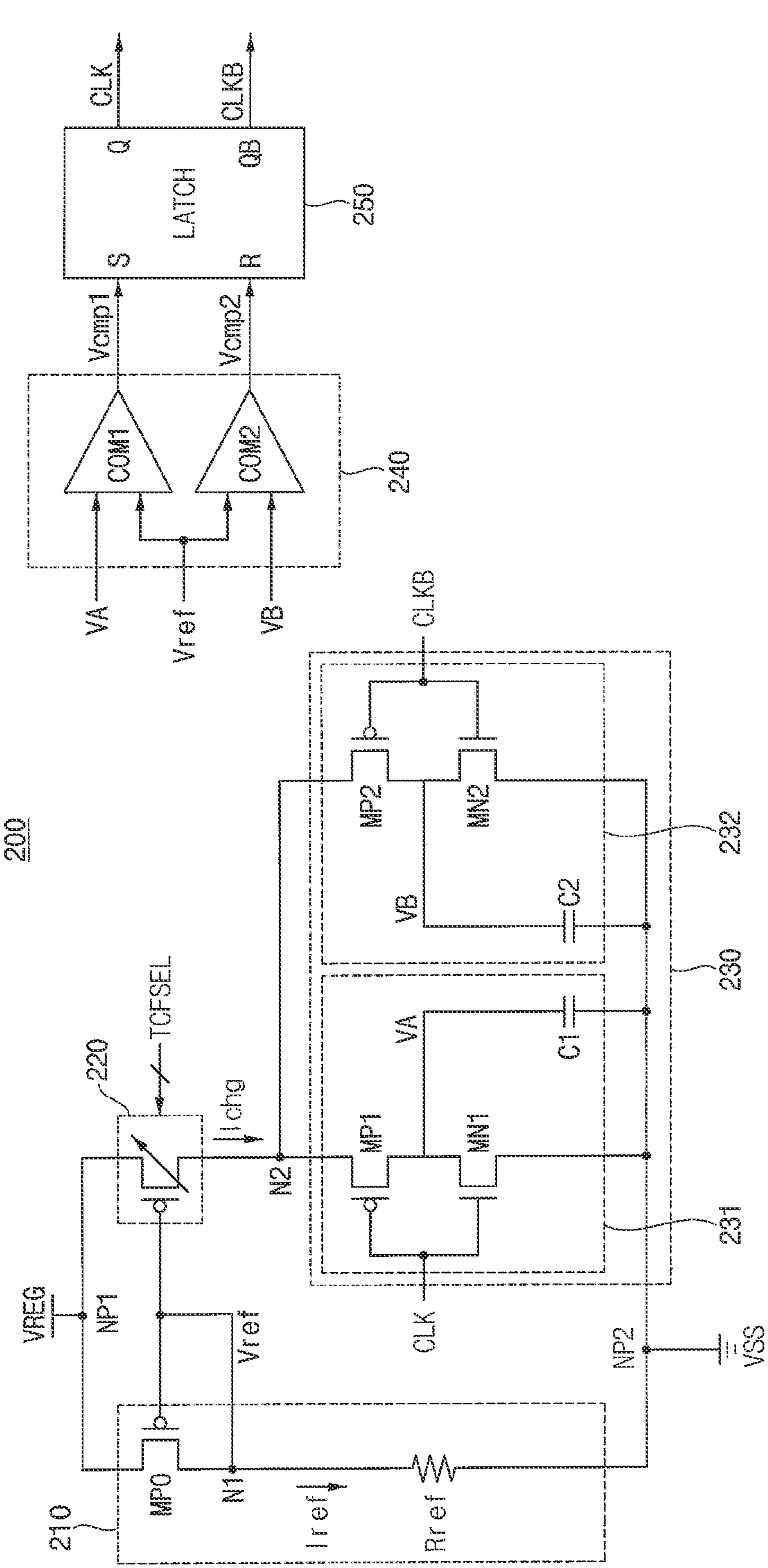
FIG. 6 is a circuit diagram illustrating an example embodiment of an oscillator included in a clock generation circuit according to some example embodiments.
Figure 7:
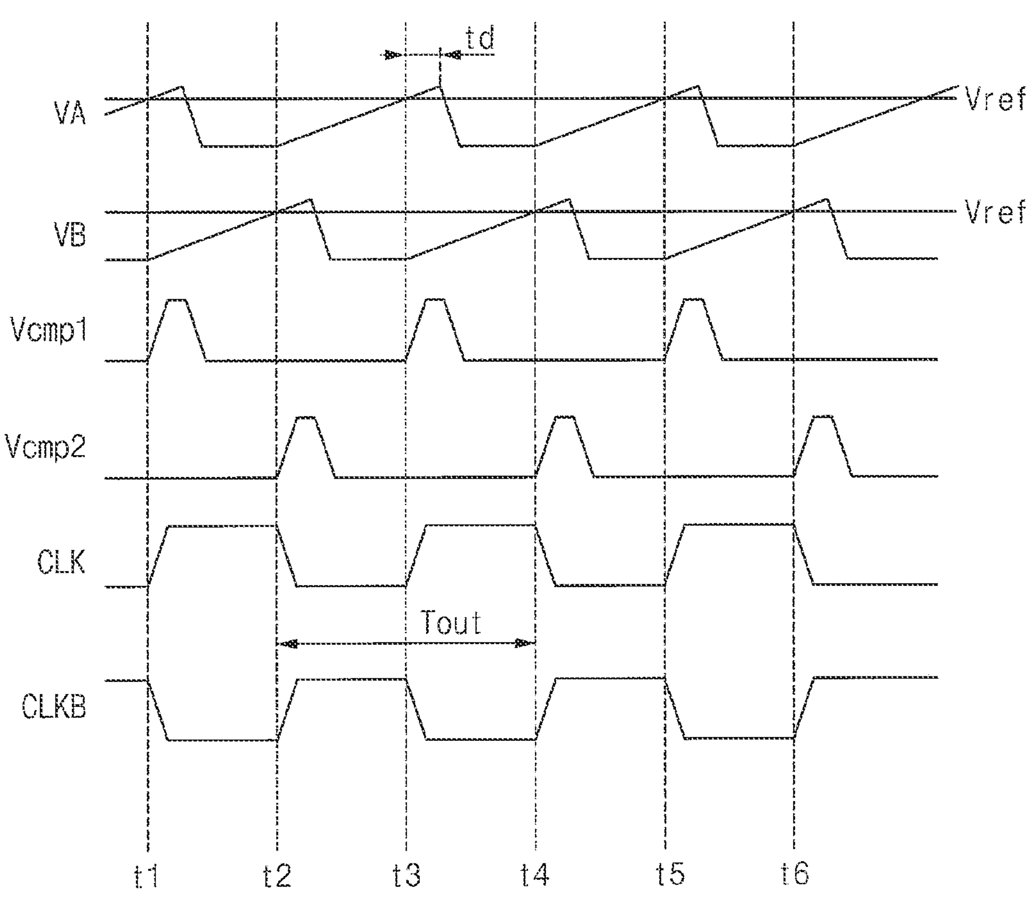
FIG. 7 is a timing diagram illustrating operations of the oscillator of FIG. 6.

FIG. 6 is a circuit diagram illustrating an example embodiment of an oscillator included in a clock generation circuit according to some example embodiments, and FIG. 7 is a timing diagram illustrating operations of the oscillator of FIG. 6.

Referring to FIG. 6, an oscillator 200 may include a reference current generator 210, a charging current generator 200, a comparison voltage generator 230, a comparing unit 240 and a latch circuit 250.

The reference current generator 210 may include a reference p-type metal-oxide-semiconductor (PMOS) transistor MP0 and a reference resistor Rref. The reference PMOS transistor MP0 may be connected between a first power node NP1 to which a regulator voltage VREG is applied and a first node N1. The reference resistor Rref may be connected between the first node N1 and a second power node NP2 to which a ground voltage VSS is applied.

The gate electrode and the drain electrode of the reference PMOS transistor MP0 may be connected electrically. The reference current generator 210 may generate a reference current Iref through the first node N1 and the voltage on the first node N1 may be provided as a reference voltage Vref.

The charging current generator 220 may be connected between the first power node NP1 and a second node N2. The charging current generator 220 may be biased with the reference voltage Vref. The reference PMOS transistor MP0 and the charging current generator 220 may form a current mirror. The charging current generator 220 may generate a charging current Ichg based on the temperature-compensated frequency selection code TCFSEL. Example embodiments of the charging current generator 220 will be described with reference to FIGS. 8 and 9. In some example embodiments, the temperature-compensated frequency selection code TCFSEL may be replaced with the frequency selection code FSEL and in this case, the charging current generator 220 may generate the charging current Ichg based on the frequency selection code FSEL.

The comparison voltage generator 230 may be connected between the second node N2 and the second power node NP2. The comparison voltage generator 230 may include a first inverting unit 231 and a second inverting unit 232. The first inverting unit 231 may receive the clock signal CLK and generate a first comparison voltage VA. The second inverting unit 232 may receive an inverted clock signal CLKB and may generate a second comparison voltage VB. The first comparison voltage VA and the second comparison voltage VB may transition in a manner complementary to each other.

The first inverting unit 231 may include a first PMOS transistor MP1 and a first n-type metal-oxide-semiconductor (NMOS) transistor MN1 that are serially connected and operate as inverters. The first inverting unit 231 may also include a first capacitor C1 for delaying a change in voltage level of the first comparison voltage VA. As illustrated in FIG. 6, the first capacitor C1 may be charged by the charging current Ichg. Therefore, the time taken by the first comparison voltage VA to transition from the low level to the high level may be determined by the charging current Ichg and the first capacitor C1.

The structure and operation of the second inverting unit 232 may be similar to the first inverting unit 231. The second inverting unit 232 may include a second PMOS transistor MP2 and a second NMOS transistor MN2 that are serially connected and operate as inverters. The second inverting unit 232 may also include a second capacitor C2 for delaying a change in voltage level of the second comparison voltage VB. As illustrated in FIG. 6, the second capacitor C2 may be charged by the charging current Ichg. Therefore, the time taken by the second comparison voltage VA to transition from the low level to the high level may be determined by the charging current Ichg and the second capacitor C2.

In some example embodiments, sizes of the second PMOS transistor MP2 and the second NMOS transistor MN2 may be the same as sizes of the first PMOS transistor MP1 and the first NMOS transistor MN1, respectively. In addition, the capacitance of the second capacitor C2 may be the same as that of the first capacitor C1. The present disclosure is not limited to these embodiments.

The comparing unit 240 may include a first comparator COM1 and a second comparator COM2. The first comparator COM1 may output first output voltage Vcmp1 which corresponds to the result of a comparison between the reference voltage Vref and the first comparison voltage VA. When the first comparison voltage VA is lower than the reference voltage Vref, the first comparator COM1 outputs the first output voltage Vcmp1 at a low level. When the first comparison voltage VA is greater than or equal to the reference voltage Vref, the first comparator COM1 may output the first output voltage Vcmp1 at a high level.

The second comparator COM2 may output a second output voltage Vcmp2 which corresponds to the result of a comparison between the reference voltage Vref and the second comparison voltage VB. When the second comparison voltage VB is lower than the reference voltage Vref, the second comparator COM2 outputs the second output voltage Vcmp2 at a low level. When the second comparison voltage VB is greater than or equal to the reference voltage Vref, the second comparator COM2 may output the second output voltage Vcmp2 at a high level.

The latch circuit 250 latches the first output voltage Vcmp1 and the second output voltage Vcmp2 and may output the clock signal CLK and the inverted clock signal CLKB. In some example embodiments, the latch circuit 250 may be implemented by an SR latch circuit as illustrated in FIG. 6. In this case, the first output voltage Vcmp1 may be applied to a first input node S of the latch circuit 250 and the second output voltage Vcmp2 may be applied to a second input node R of the latch circuit 250.

When the voltage levels of the first output voltage Vcmp1 and the second output voltage Vcmp2 are different (e.g., when the first output voltage Vcmp1 is at a high level and the second output voltage Vcmp2 is at a low level), the latch circuit 250 outputs the clock signal CLK at the same level as the first output voltage Vcmp1 through a first output node Q and may output the inverted clock signal CLKB at the same level as the second output voltage Vcmp2 through a second output node QB. When the first output voltage Vcmp1 and the second output voltage Vcmp2 are at a low level, the latch circuit 250 may output the clock signal CLK and the inverted clock signal CLKB in the same state as a previous state through the first output node Q and the second output terminal QB, respectively.

Referring to FIG. 7, it is assumed that the first output node Q of the latch circuit 250 is initialized to a low level and the second output node QB of the latch circuit 250 is initialized to a high level.

When the first comparison voltage VA is higher than the reference voltage Vref at time point t1, the first output voltage Vcmp1 is at a high level and the second output voltage Vcmp2 is at a low level. As a result, the latch circuit 250 outputs a signal at a high level through the first output node Q and outputs a signal at a low level through the second output node QB. The signals output from the first output node Q and the second output node QB of the latch circuit 250 may be respectively applied to the first inverting unit 231 and the second inverting unit 232 of the comparison voltage generator 230. As a result, the first comparison voltage VA transitions from the high level to the low level and the second comparison voltage VB transitions from the low level to the high level. In this case, until the second comparison voltage VB is greater than or equal to the reference voltage Vref, the first comparator COM1 and the second comparator COM2 output signals at a low level and the latch circuit 250 may maintain a previous state, in which the first output node Q is at the high level and the second output node QB is at the low level.

When the second comparison voltage VB is greater than or equal to the reference voltage Vref at time point t2, the first comparator COM1 outputs the first output voltage Vcmp1 at a low level and the second comparator COM2 outputs the second output voltage Vcmp2 at a high level. As a result, the latch circuit 250 outputs a signal at a low level through the first output node Q and outputs a signal at a high level through the second output node QB. Therefore, the first comparison voltage VA transitions from the low level to the high level and the second comparison voltage VB transitions from the high level to the low level. In this case, until the first comparison voltage VA is greater than or equal to the reference voltage Vref, the first comparator COM1 and the second comparator COM2 output signals at a low level and the latch circuit 250 may maintain a previous state, in which the first output node Q is at the low level and the second output node QB is at the high level.

When the first comparison voltage VA is greater than or equal to the reference voltage Vref at time point t3, the first comparator COM1 outputs the first output voltage Vcmp1 at a high level and the second comparator COM2 outputs the second output voltage Vcmp2 at a low level. As a result, the latch circuit 250 outputs a signal at a high level through the first output node Q and outputs a signal at a low level through the second output node QB. The above operations are repeated so that the clock signal CLK oscillates with a predetermined period.

As illustrated in FIG. 7, there is a delay time td between the clock signal CLK and the comparison voltages VA and VB. The delay time td may be due to the delay of operation of the comparators COM1 and COM2 and an input offset deviation of the comparators COM1 and COM2.

The deviations of the delay time and the input offset of the two comparators COM1 and COM2 may be varied depending on process, voltage and temperature (PVT). Even though the RC relaxation oscillator may be less sensitive to the PVT than the oscillator of a ring type, the RC relaxation oscillator may be affected by the PVT, particularly by the voltage and the temperature.

The power of the comparators may be increased so as to operate in a manner that is less sensitive to the voltage and the temperature. In addition, the size of the transistors in the comparators may be increased so as to reduce the input offset. Further, a band-gap reference (BGR) voltage generator that provides a constant voltage to a static current source may occupy a large area. In general, the BGR voltage generator uses a bipolar junction transistor (BJT) that operates with a power supply voltage of a higher level than a metal oxide semiconductor (MOS) transistor. In addition, the BJT requires an additional mask process to increase manufacturing costs. As such, schemes using a BGR circuit may exhibit increased power, size and cost requirements.

According to some example embodiments, the delay of the comparators COM1 and COM2 may be reflected by generating the temperature-compensated frequency selection code TCFSEL using weight factor information WFINF as will be described below. As such, the clock generation circuit according to some example embodiments may generate the clock signal CLK having a more uniform frequency regardless of the operation temperature.

The cyclic period Tout of the clock signal CLK according to the repeated charging and discharging of the nodes of the comparison voltages VA and VB may be represented by the following equation.

$$Tout=(C*Vref)/Ichg=(C*R*Iref)/(FSEL*Iref)=(R*C)/FSEL$$

As shown in the above equation, the cyclic period Tout of the clock signal CLK from the RC oscillator may be determined by the values R and C of a resistor and a capacitor.

The value of the frequency selection code FSEL may be used to adjust the charging current Ichg and trim the frequency of the clock signal CLK to the target frequency Ft. In addition, the frequency may be varied even though the value of the frequency selection code FSEL is maintained, if the variation of the resistor occurs due to process variations.

If the reference resistor Rref has the CTAT characteristic, as the operation temperature increases the charging current Ichg may increase, the delay time td may decrease, and the frequency of the clock signal CLK may increase. In other words, the temperature coefficient of the reference resistor Rref and the frequency temperature coefficient of the oscillator 200 may have opposite phases. Accordingly, the frequency of the clock signal CLK may be varied depending on the operation temperature if the frequency selection code FSEL is fixed.

According to some example embodiments, a functionality and a yield of products using a clock signal may be enhanced through using the temperature-compensated frequency selection code TCFSEL that counterbalances the temperature characteristic of the oscillator 200.

Figure 8:
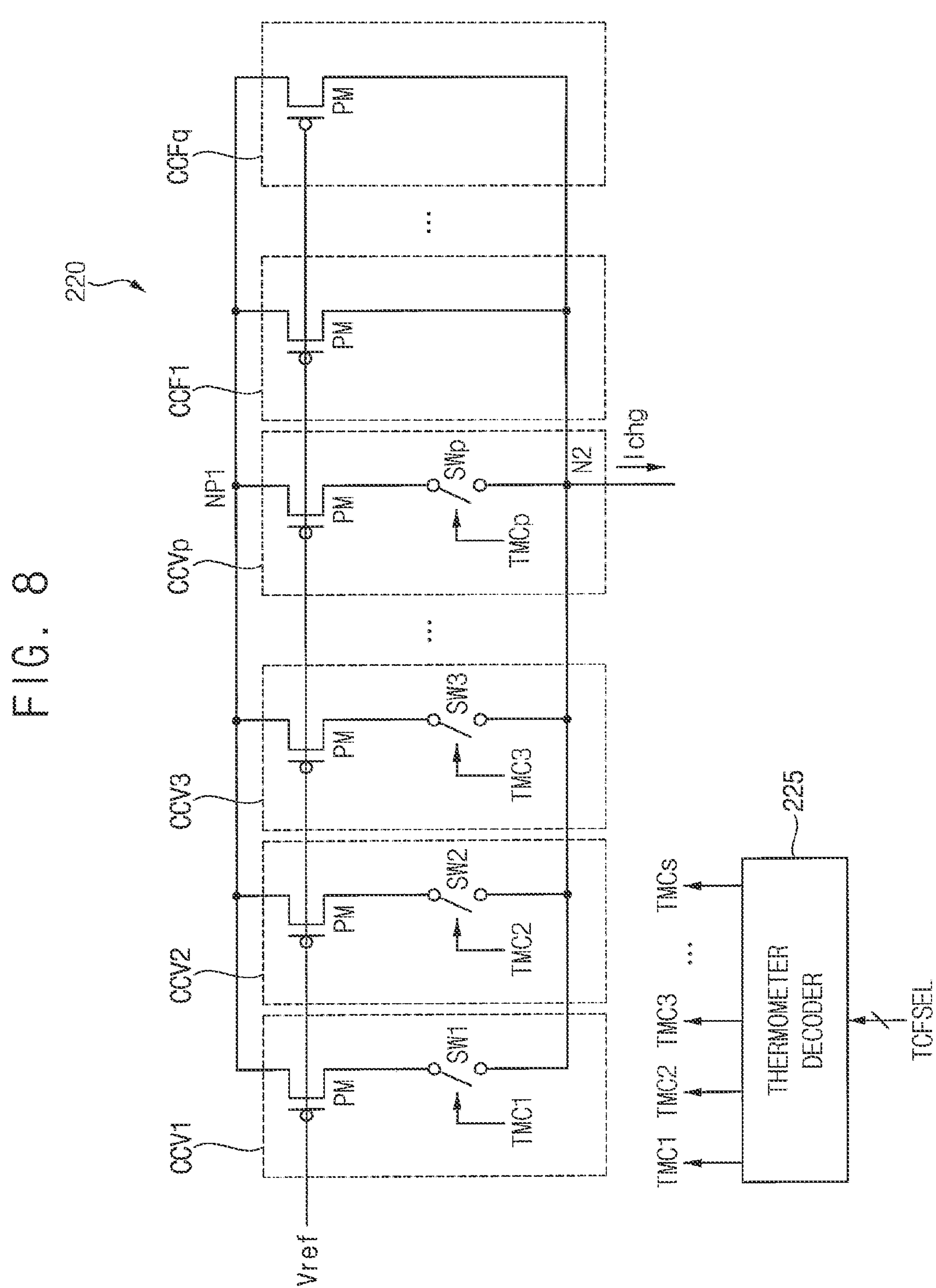
FIG. 8 is a circuit diagram illustrating an example embodiment of a charging current generator included in the oscillator of FIG. 6.
Figures 9, 10:
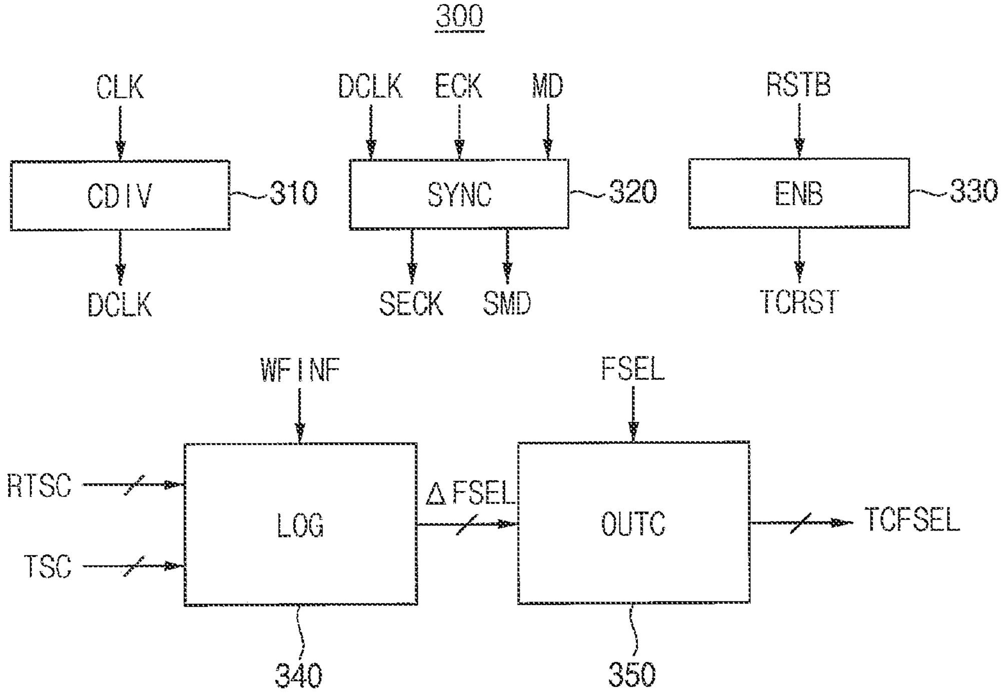
FIG. 9 is diagram for describing a thermometer trimming method of the charging current generator of FIG. 8.
FIG. 10 is a block diagram illustrating an example embodiment of a temperature compensation circuit included in a clock generation circuit according to some example embodiments.

FIG. 8 is a circuit diagram illustrating an example embodiment of a charging current generator 220 included in the oscillator of FIG. 6, and FIG. 9 is diagram for describing a thermometer trimming method of the charging current generator 220 of FIG. 8.

Referring to FIG. 8, a charging current generator 220 included in the oscillator 200 of FIG. 6 may include variable current cells CCV1~CCVp, one or more fixed current cells CCF1~CCFq and a thermometer decoder 225. In some example embodiments, the thermometer decoder 225 may be outside the oscillator 200, and as such, the oscillator 200 may receive a thermometer code TMC instead of the temperature-compensated frequency selection code TCFSEL or the frequency selection code FSEL.

The variable current cells CCV1~CCVp and the fixed current cells CCF1~CCFq may be connected in parallel between the first power node NP1 and the second node NP2.

The variable current cells CCV1~CCVp may include PMOS transistors PM and switches SW1~SWp, respectively. The switches SW1~SWp may be turned based on bits TMC1~TMCs of the thermometer code TMC, respectively. Each of the variable current cells CCV1~CCVp may provide a unit current to the second node N2 when the corresponding switch is turned on.

The fixed current cells CCF1~CCFq may include the PMOS transistors PM, respectively, and each of the fixed current cells CCF1~CCFq may provide the unit current to the second node N2 regardless of the thermometer code TMC.

As such, the charging current Ichg flowing through the second node N2 may be determined based on the unit current, the number of the fixed current cells, and the number of variable current cells that are turned on. If the size of each of the PMOS transistors PM in FIG. 8 is the same, (in other words, if each of the variable current cells CCV1~CCVp and the fixed current cells CCF1~CCFq generates the same unit current), the charging current may be represented by the following equation.

$$Ichg=(p'+q)*Iu$$

In the above equation, p' indicates the number of the variable current cells that are turned on, q indicates the number of the fixed current cells, and Iu indicates the unit current.

The thermometer decoder 225 may convert the temperature-compensated frequency selection code TCFSEL, which may correspond to a binary code of M bits to the thermometer code TMC of $2^M-1$ bits. In other words, s may be equal to $2^M-1$. In some example embodiments, the temperature-compensated frequency selection code TCFSEL may be determined based on the difference between the measured frequency and the target frequency of the clock signal CLK.

The charging current generator 220 may include the PMOS transistors of the same size, and may control switching of the PMOS transistors using the thermometer code TMC. The frequency of the clock signal CLK may be varied linearly depending on the value of the temperature-compensated frequency selection code TCFSEL.

FIG. 9 illustrates an example of a three-bit temperature-compensated frequency selection code TCFSEL[2:0] and a corresponding seven-bit thermometer code TMC[7:1]. According to example embodiments, the bit number of the temperature-compensated frequency selection code TCFSEL may be determined variously.

As illustrated in FIG. 9, the thermometer decoder 225 in FIG. 8 may convert the three-bit temperature-compensated frequency selection code TCFSEL[2:0] to the seven-bit thermometer code TMC[7:1]. The number of the bits of the seven-bit thermometer code TMC[7:1] having a value of "1" may be increased as the value of the three-bit temperature-compensated frequency selection code TCFSEL[2:0] is increased. Accordingly, the number of the variable current cells that are turned on may be increased one by one or incrementally as the value of the temperature-compensated frequency selection code TCFSEL[2:0] is increased gradually or incrementally.

A good matching characteristic may be implemented if the PMOS transistors PM in the charging current generator 220 have the same width W and the same length L, where a size of a transistor is represented by W/L. The linearity of the frequency change of the clock signal CLK may be further enhanced when the entire size or array of the transistors is controlled though a binary trimming scheme, such that switching of transistors having different sizes (e.g., W/L, 2*W/L, 4*W/L, 8*W/L, etc.) is controlled using a thermometer code.

FIG. 10 is a block diagram illustrating an example embodiment of a temperature compensation circuit included in a clock generation circuit according to some example embodiments.

Referring to FIG. 10, a temperature compensation circuit 300 may include a clock divider CDIV 310, a synchronization circuit SYNC 320, a start-up enable circuit ENB 330, a logic circuit LOG 340, and an output circuit OUTC 350.

The clock divider 310 may generate a divided clock signal DCLK by dividing a frequency of the clock signal CLK from the oscillator 200 in FIG. 1.

The synchronization circuit 320 may generate a synchronized external clock signal SECK by synchronizing an external clock signal ECK with the divided clock signal DCLK, where the external clock signal ECK is provided to the temperature compensation circuit 300 in synchronization with the operation temperature code TSC. In some example embodiments, as will be described in greater detail below with reference to FIG. 12, the logic circuit 340 may receive the reference temperature code RTSC and the operation temperature code TSC in synchronization with the synchronized external clock signal SECK.

In some example embodiments, the synchronization circuit 320 may receive a mode signal MD and may generate a synchronized mode signal SMD by synchronizing the mode signal MD with the divided clock signal DCLK. The logic circuit 340 and the output circuit 350 may be enabled based on the synchronized mode signal SMD. As will be described in greater detail below with reference to FIGS. 18 and 19, the mode signal MD and the synchronized mode signal SMD may indicate a temperature compensation mode or a normal mode. Power consumption may be reduced by disabling unnecessary circuits in the normal mode based on the synchronized mode signal SMD.

The start-up enable circuit 330 may generate a compensated reset signal TCRST by synchronizing a voltage reset signal RSTB with the divided clock signal DCLK. The voltage reset signal RSTB may indicate a power-up timing of the regulator voltage VREG that is applied to the oscillator 200 as described with reference to FIG. 5. In some example embodiments, as will be described in greater detail below with reference to FIGS. 15 through 17, the oscillator 200 may be enabled in response to the compensated reset signal TCRST.

The logic circuit 340 may generate a correction code ΔFSEL based on the difference between the operation temperature and the reference temperature. The logic circuit 340 may receive the reference temperature code RTSC indicating the reference temperature, the operation temperature code TSC indicating the operation temperature, and weight factor information WFINF, and generate the AFSEL based on the reference temperature code RTSC, the operation temperature code TSC, and the weight factor information WFINF.

The output circuit 350 may generate the temperature-compensated frequency selection code TCFSEL by summing the correction code ΔFSEL and the frequency selection code FSEL that is fixed regardless of the operation temperature.

Figure 11:
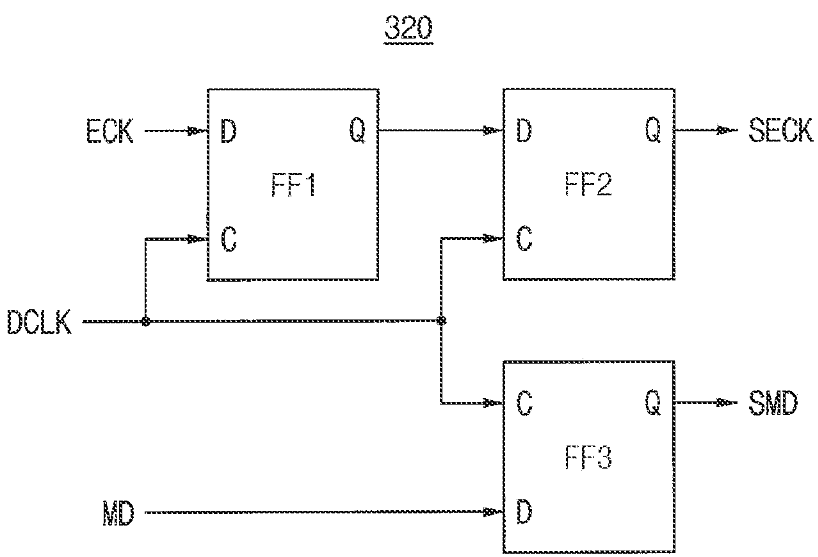
FIG. 11 is a diagram illustrating an example embodiment of a synchronization circuit included in the temperature compensation circuit of FIG. 10.

FIG. 11 is a diagram illustrating an example embodiment of a synchronization circuit included in the temperature compensation circuit of FIG. 10.

Referring to FIG. 11, the synchronization circuit 320 may include a first flip-flop FF1, a second flip-flop FF2 and a third flip-flop FF3.

The first flip-flop FF1 may include a data terminal D that receives the external clock signal ECK and a clock terminal C that receives the divided clock signal DCLK. The second flip-flop FF2 may include a data terminal D connected to an output terminal Q of the first flip-flop FF1 that receives an output of the first flip-flop FF1, a clock terminal C that receives the divided clock signal DCLK, and an output terminal Q that outputs the synchronized external clock signal SECK. The third flip-flop FF3 may include a data terminal D that receives the mode signal MD, a clock terminal C that receives the divided clock signal DCLK, and an output terminal Q that outputs the synchronized mode signal SMD.

As such, the synchronization circuit 320 may generate the synchronized external clock signal SECK and the synchronized mode signal SMD by synchronizing the external clock signal ECK and the mode signal MD with the divided clock signal DCLK. In some example embodiments, as will be described in greater detail below with reference to FIG. 12, the logic circuit 340 may receive the reference temperature code RTSC and the operation temperature code TSC in synchronization with the synchronized external clock signal SECK.

Figure 12:
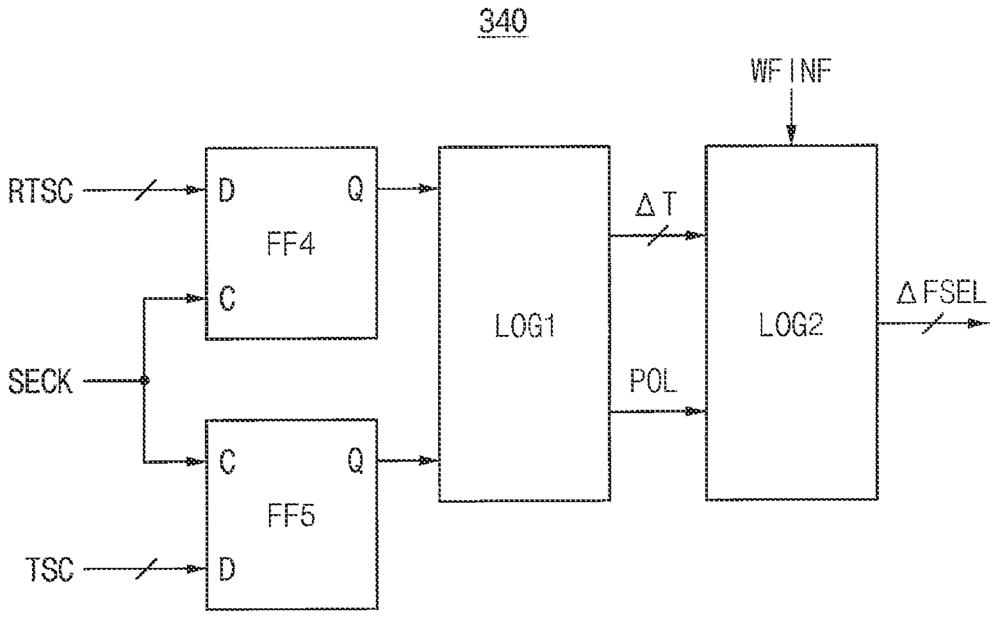
FIG. 12 is a diagram illustrating an example embodiment of a logic circuit included in the temperature compensation circuit of FIG. 10.

FIG. 12 is a diagram illustrating an example embodiment of a logic circuit included in the temperature compensation circuit of FIG. 10.

Referring to FIG. 12, the logic circuit 340 may include a first flip-flop FF4, a second flip-flop FF5, a first logic circuit LOG1 and a second logic circuit LOG2.

The first flip-flop FF4 may include a data terminal D receiving the reference temperature code RTSC and a clock terminal C that receives the synchronized external clock signal SECK. The second flip-flop FF2 may include a data terminal D that receives the operation temperature code TSC and a clock terminal C that receives the synchronized external clock signal SECK. As such, the logic circuit 340 may receive the reference temperature code RTSC and the operation temperature code TSC in synchronization with the synchronized external clock signal SECK using the first flip-flop FF4 and the second flip-flop FF5.

The first logic circuit LOG1 may generate a temperature difference value ΔT that indicates a difference between the reference temperature code RTSC, which corresponds to the reference temperature, and the operation temperature code TSC, which corresponds to the operation temperature. The first logic circuit LOG1 may also generate a polarity signal POL that indicates whether the operation temperature is higher than the reference temperature.

The second logic circuit LOG2 may generate the correction code ΔFSEL based on the temperature difference value ΔT, the polarity signal POL, and the weight factor information WFINF. As will be described in greater detail below with reference to FIG. 13, the correction code ΔFSEL may be added to the frequency selection code FSEL to generate the temperature-compensated frequency selection code TCFSEL. In other words, the correction code ΔFSEL may correspond to a difference between the frequency selection code FSEL and the temperature-compensated frequency selection code TCFSEL.

In some example embodiments, the second logic circuit LOG2 may generate the temperature-compensated frequency selection code TCFSEL according to the following equation:

$$TCFSEL=(FSEL+\mathrm{LO})*WF*\Delta T+\mathrm{LO}$$

In the above equation, TCFSEL indicates the temperature-compensated frequency selection code, FSEL indicates the frequency selection code, WF indicates a weight factor, ΔT indicates the difference between the operation temperature and the reference temperature, and LO indicates a constant value.

The temperature difference value ΔT may be determined as a positive value or a negative value based on the polarity signal POL. The constant value LO may indicate the number of the fixed current cells that are turned on regardless of the temperature-compensated frequency selection code TCFSEL. In other words, the constant value LO may indicate the current cells that are turned on that are not the variable current cells (see FIG. 8) that are turned on depending on the temperature-compensated frequency selection code TCFSEL. The weight factor WF may be determined based on the weight factor information WFINF to determine a degree of increasing or decreasing according to the variation of the operation temperature.

In some example embodiments, the weight factor WF may have a value that is fixed regardless of the operation temperature. For example, the weight factor WF may be determined based on the temperature coefficient values of resistors provided in the CMOS process. The weight factor WF may reduce the effect of the temperature variation caused by the resistors.

If the RC oscillator is used to generate a clock signal of a high frequency, e.g., several MHz, the comparator delay as described with reference to FIG. 7, as well as the values of the resistors and the capacitors, may affect the frequency significantly. The weight factor WF may be determined to reflect the comparator delay and/or the temperature coefficient values of the resistors.

In some example embodiments, the weight factor WF may include a high-temperature weight factor that corresponds to the operation temperature being higher than the reference temperature, and a low-temperature weight factor that corresponds to the operation temperature being lower than the reference temperature, as represented by following equations.

$$WF\_HT=[(FSEL\_HT+LO)/(FSEL\_RT+LO)]/(HT-RT)$$

$$WF\_LT=[(FSEL\_LT+LO)/(FSEL\_RT+LO)]/(RT-LT)$$

In the above equations, WF_HT indicates the high-temperature weight factor, WF_LT indicates the low-temperature weight factor, RT indicates the reference temperature, HT indicates the operation temperature that is higher than the reference temperature, LT indicates the operation temperature that is lower than the reference temperature, FSEL_RT indicates the frequency selection code that corresponds to the reference temperature, FSET_HT indicates the frequency selection code that corresponds to the operation temperature that is higher than the reference temperature, and FSEL_LT indicates the frequency selection code that corresponds to the operation temperature that is lower than the reference temperature.

As shown in the above equations, the weight factor WF may be varied depending on the operation temperature. In some example embodiments, each of the frequency selection codes FSEL_HT and FSEL_LT may be determined as an optimum value by performing a post-layout simulation.

In some example embodiments, the frequency of the clock signal CLK may be measured by varying the operation temperature, and the frequency selection codes FSEL_HT and FSEL_LT may be determined based on the results of the measurement.

The frequency selection codes FSEL_HT and FSEL_LT may be provided as functions that utilize the operation temperature as an independent parameter, or as a mapping table that includes values that are mapped to a plurality of values of the operation temperature.

Figure 13:
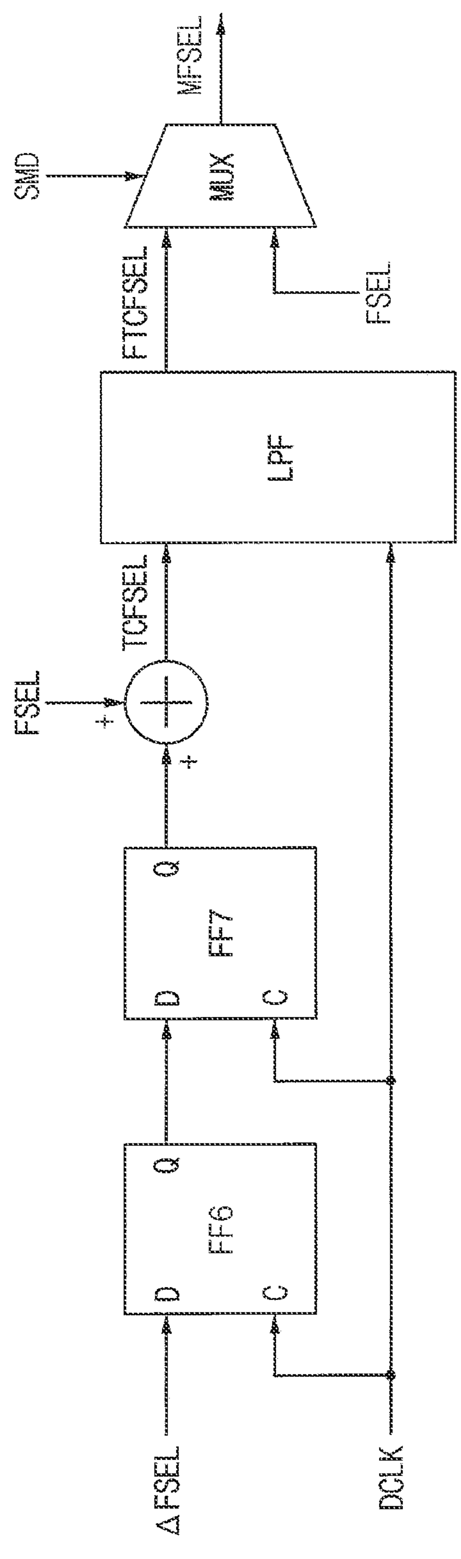
FIG. 13 is a diagram illustrating an example embodiment of an output circuit included in the temperature compensation circuit of FIG. 10.

FIG. 13 is a diagram illustrating an example embodiment of an output circuit included in the temperature compensation circuit of FIG. 10.

Referring to FIG. 13, the output circuit 350 may include a flip-flop FF6, a second flip-flop FF7, an adder, a low-pass filter LPF and a selector MUX.

The first flip-flop FF6 may include a data terminal D that receives the correction code ΔFSEL and a clock terminal C that receives the divided clock signal DCLK. The second flip-flop FF7 may include a data terminal D that is connected to an output terminal Q of the first flip-flop FF6 and receives an output of the first flip-flop FF6, and a clock terminal C that receives the divided clock signal DCLK. The adder may sum an output of the second flip-flop FF7 and the frequency selection code FSEL to output the temperature-compensated frequency selection code TCFSEL.

The low-pass filter LPF may perform low-pass filtering with respect to the temperature-compensated frequency selection code TCFSEL to output a filtered temperature-compensated frequency selection code FTCFSEL.

The selector MUX may output the filtered temperature-compensated frequency selection code FTCFSEL in a temperature compensation mode and output the frequency selection code FSEL in a normal mode, based on the synchronized mode signal SMD that indicates the temperature compensation mode or the normal mode. In other words, the selector MUX may output the filtered temperature-compensated frequency selection code FTCFSEL or the frequency selection code FSEL as a selected code MFSEL. In some example embodiments, the synchronized mode signal SMD may be replaced with the mode signal MD.

In some example embodiments, the low-pass filter LPF may be omitted. As such, the filtered temperature-compensated frequency selection code FTCFSEL may be replaced with the temperature-compensated frequency selection code TCFSEL.

According to some example embodiments, the selector MUX may be omitted and only the temperature compensation mode may be performed. When the output circuit 350 includes the selector MUX, the above-described temperature-compensated frequency selection code TCFSEL may be replaced with the selected code MFSEL.

Figure 14:
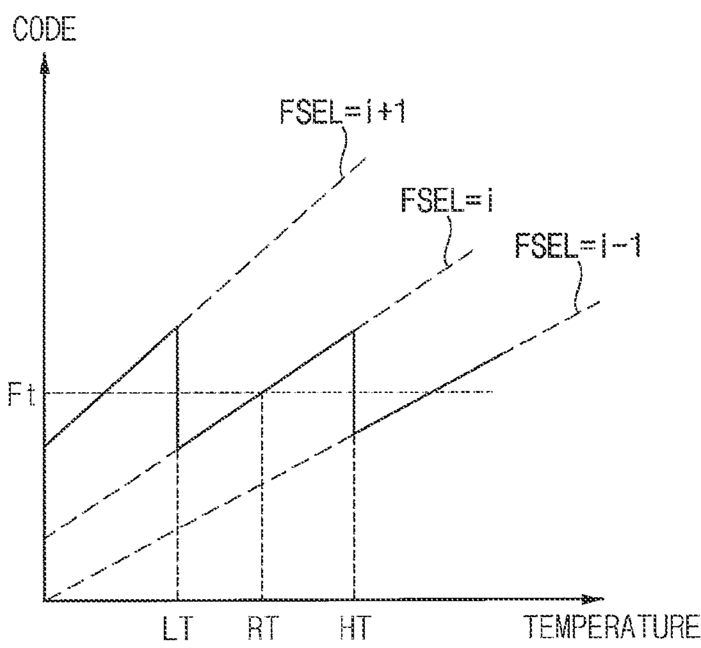
FIG. 14 is a diagram illustrating an example embodiment of an operation of a clock generation circuit according to example embodiments.

FIG. 14 is a diagram illustrating an example embodiment of an operation of a clock generation circuit according to some example embodiments.

The frequency selection code FSEL may be trimmed through a test operation such that the frequency selection code FSEL may correspond to a target frequency Ft of the clock signal CLK at the reference temperature (e.g., the room temperature of about 25° C.). It is assumed that the oscillator 200 has the PTAT characteristic.

Referring to FIG. 14, the value i of frequency selection code FSEL that is trimmed at the reference temperature RT may be decreased to the value i−1 at the high temperature HT. In contrast, the value i of frequency selection code FSEL that is trimmed at the reference temperature RT may be increased to the value i+1 at the low temperature LT. As illustrated in FIG. 14, the frequency may be maintained uniformly or more uniformly near the target frequency FT by changing the frequency selection code FSEL depending on the operation temperature. The amount of change of the frequency selection code FSEL may be determined based on the operation temperature code TSC that indicates the operation temperature.

Figure 15:
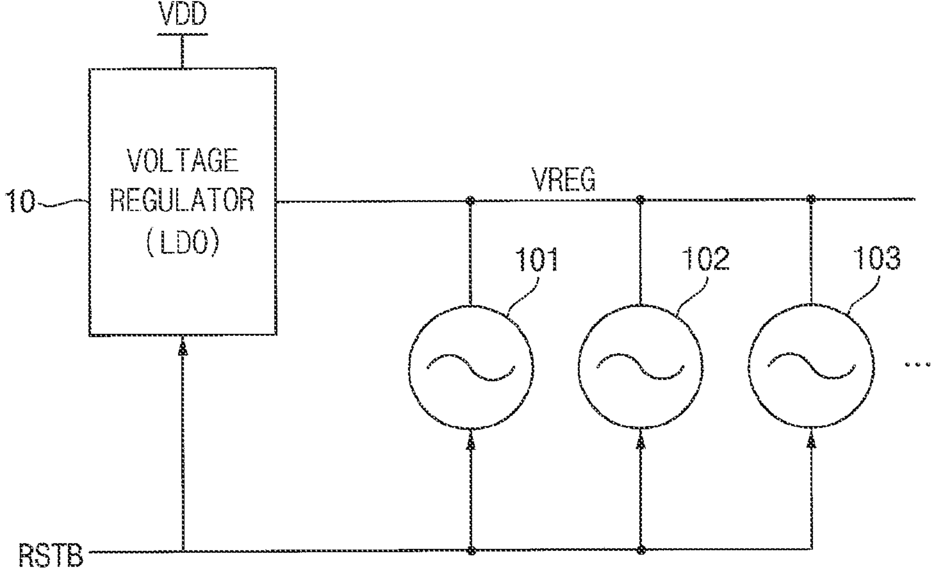
FIG. 15 is a diagram for describing processes of enabling a clock generation circuit according to some example embodiments.

FIG. 15 is a diagram for describing processes of enabling a clock generation circuit according to some example embodiments.

Referring to FIG. 15, a semiconductor integrated circuit may include a plurality of clock generation circuits 101, 102 and 03.

Some products may use the output of an oscillator as a main clock, and may generate a regulator voltage VREG using a voltage regulator 10, such as the low drop output (LDO) regulator, and use the regulator voltage VREG as a power voltage of the clock generation circuits 101, 102 and 103. The deviation of the frequency of the oscillator may be reduced and the deviation of the manufacturing process may be removed through the one-point trimming of the target frequency of the oscillator.

The effect of the operation temperature may be reduced through the temperature compensation circuit 300 as described above according to some example embodiments. However, the voltage regulator 10 and the oscillators included in the clock generation circuits 101, 102 and 103 are turned on simultaneously in response to a voltage reset signal RSTB when an external clock source cannot be provided to the semiconductor integrated circuit in FIG. 15. In some situations, the transition of the voltage reset signal RSTB may occur before the regulator voltage VREG is stabilized, and the oscillators in the clock generation circuits 101, 102 and 103 may be reset with unknown values. In addition, the temperature compensation circuit 300 may operate abnormally. To prevent such abnormal reset of the clock generation circuits 101, 102 and 103, a start-up enable circuit composed of simple logic may be used, as described in greater detail herein.

Figure 16:
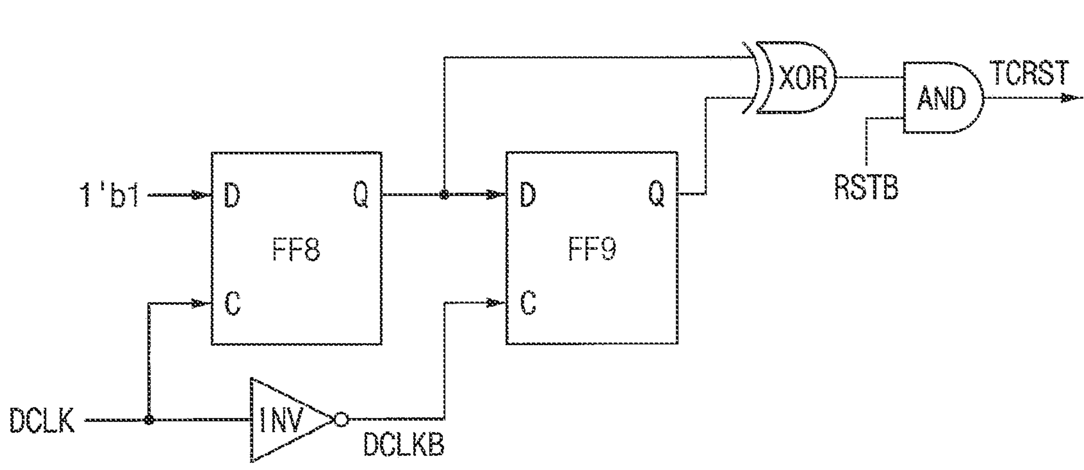
FIG. 16 is a diagram illustrating an example embodiment of a start-up enable circuit included in the temperature compensation circuit of FIG. 10.
Figure 17:
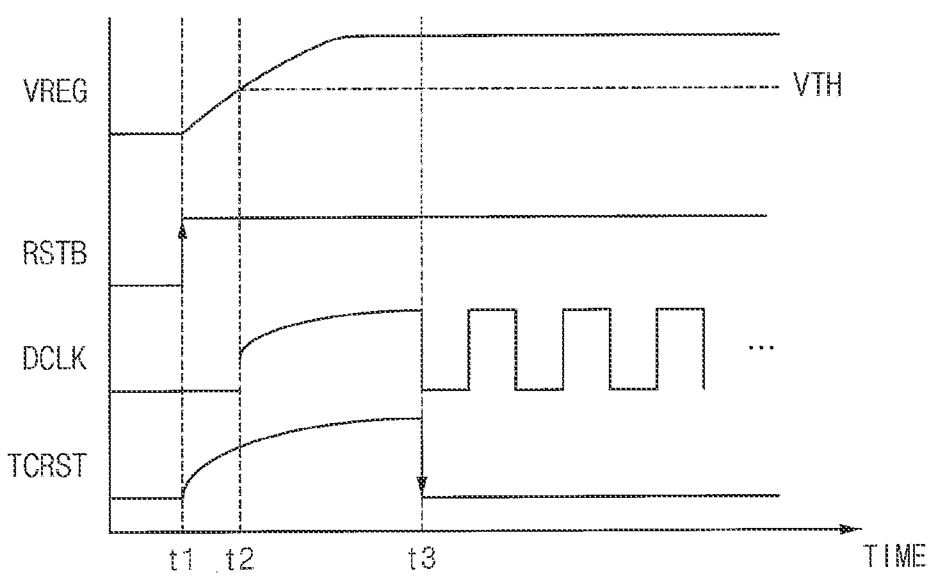
FIG. 17 is a timing diagram illustrating an operation of the start-up enable circuit of FIG. 16.

FIG. 16 is a diagram illustrating an example embodiment of a start-up enable circuit included in the temperature compensation circuit of FIG. 10, and FIG. 17 is a timing diagram illustrating an operation of the start-up enable circuit of FIG. 16.

Referring to FIG. 16, a start-up enable circuit 330 may include a first flip-flop FF8, an inverter INV, a second flip-flop FF9, an XOR gate and an AND gate.

The first flip-flop FF8 may include a data terminal D that receives a voltage of a logic high level 1'b1 and a clock terminal C that receives the divided clock signal DCLK. The inverter INV may generate an inverted-divided clock signal DCLKB by inverting the divided clock signal DCLK. The second flip-flop FF9 may include a data terminal D connected to an output terminal Q of the first flip-flop FF8 to receive an output of the first flip-flop FF8 and a clock terminal C that receives the inverted-divided clock signal DCLKB. The XOR gate may perform an XOR logic operation on the output of the first flip-flop FF8 and an output of the second flip-flop FF9. The AND gate may perform an AND operation on an output of the XOR gate and the voltage reset signal RSTB to generate the compensated reset signal TCRST.

Referring to FIGS. 16 and 17, the first flip-flop FF8 may sample the voltage of the logic high level 1'1b at a rising edge of the divided clock signal DCLK and the second flip-flop FF9 may sample the output of the first flip-flop FF8 at a falling edge of the divided clock signal DCLK. Through the XOR logic operation on the outputs of the first and second flip-flops FF8 and FF9 and the AND logic operation on the output of the XOR logic gate and the voltage reset signal RSTB, a compensated reset signal TCRST may generated as illustrated in FIG. 17.

At time point t1, the voltage reset signal RSTB toggles and the regulator voltage VREG may begin increasing. At time point t2 when the regulator voltage VREG begins to exceed the threshold voltage VTH of the transistors in the start-up enable circuit 330, the divided clock signal DCLK may being toggling. The compensated reset signal TCRST may transition to the logic high level to reset the logic values in the clock generation circuits 101, 102 and 103, and transition back to the logic low level at time point t3 that corresponds to the falling edge of the divided clock signal DCLK. In this wary, the start-up enable circuit 330 may support a power sequence-free operation between transitions of the voltage reset signal RSTB and the regulator voltage VREG.

As such, the clock generation circuit according to some example embodiments may be various products as a sub IP or sub-component of another system or an independent clock source, through the power sequence free operation of the start-up enable circuit 330.

Figure 18:
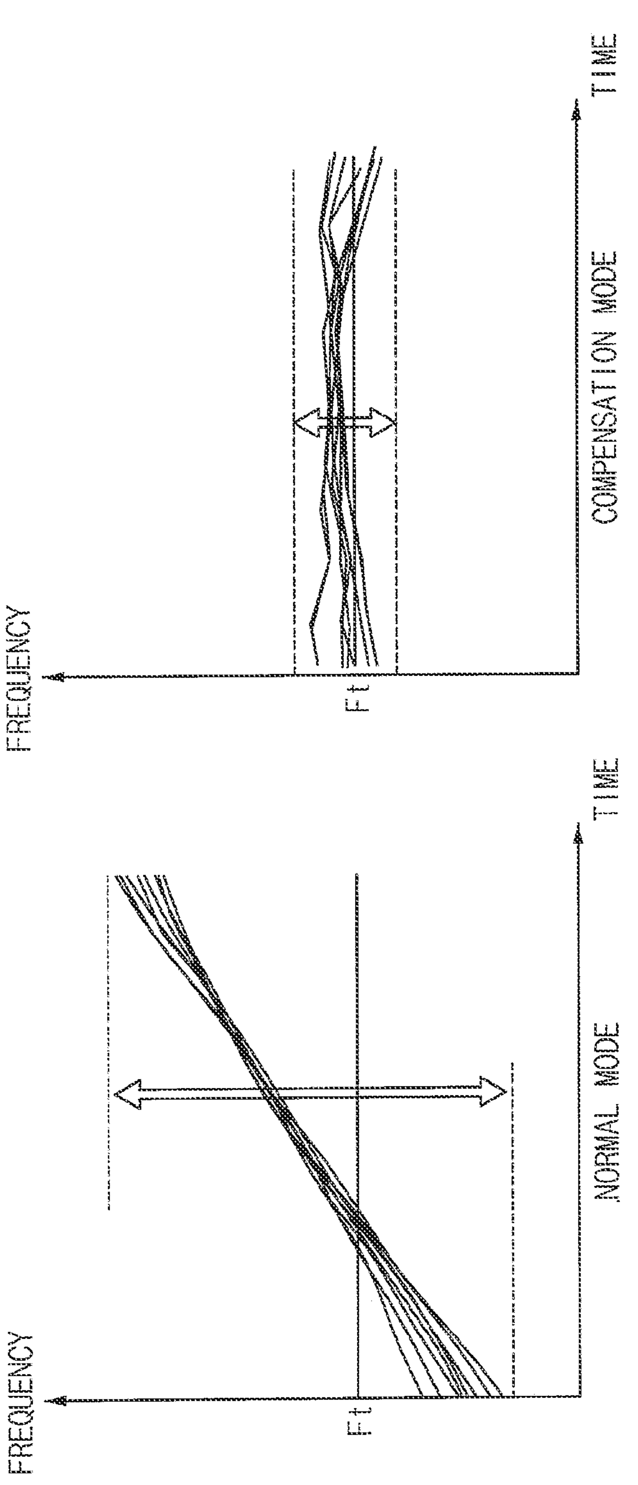
FIGS. 18 and 19 are diagrams illustrating operation modes of a clock generation circuit according to some example embodiments.
Figure 19:
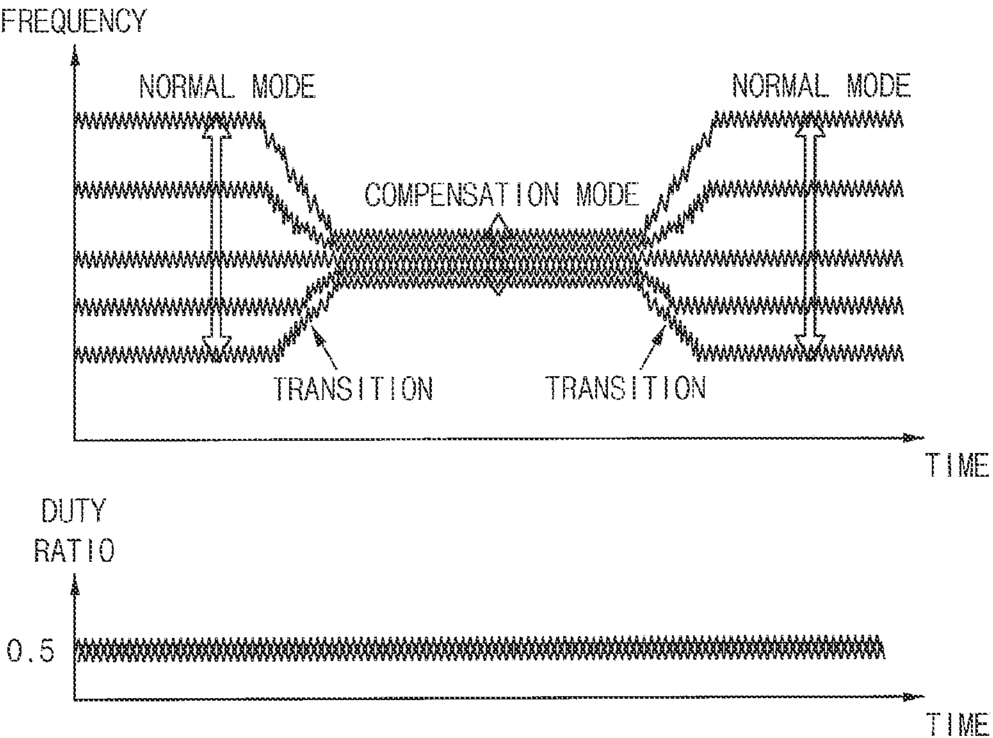

FIGS. 18 and 19 are diagrams illustrating operation modes of a clock generation circuit according to some example embodiments.

FIG. 18 illustrates example simulation results of a clock generation circuit according to some example embodiments.

The left simulation result in FIG. 18 is obtained by applying the frequency selection code FSEL that has the fixed value regardless of the operation temperature to the RC oscillator in the normal mode with respect to several process, voltage and temperature (PVT) conditions. The right simulation result in FIG. 18 is obtained by applying the temperature-compensated frequency selection code TCFSEL, which may vary depending on the operation temperature, to the RC oscillator. The accuracy of the target frequency may be improved using the temperature-compensated frequency selection code TCFSEL instead of the frequency selection code FSEL.

FIG. 19 illustrates a simulation result when the operation mode is changed from the normal mode to the temperature compensation mode, and then back to the normal mode, with respect to various PVT conditions. A finite impulse response (FIR) low-pass filter has been used such that the frequency of the clock signal may be changed slowly. When both of the rising edge and the falling edge of the clock signal are used in a semiconductor integrated circuits, it may be desirable or even a requirement to maintain the duty ratio of the clock signal. As illustrated in FIG. 19, the duty ratio of the clock signal may be maintained uniformly or more uniformly as well as the frequency of the clock signal.

In a semiconductor integrated circuit, throttling may be adopted such that the operation speed of the semiconductor integrated circuit may be lowered compulsorily when the operation temperature of the semiconductor integrated circuit increases higher than a threshold value. The throttling scheme may be implemented using the temperature compensation circuit according to some example embodiments. The abnormal operation of the semiconductor integrated circuit may be caused when the frequency of the clock signal changes abruptly. As described with reference to FIG. 13, the temperature-compensated frequency selection code TCFSEL may be input to the low-pass filter LPF to generate the filtered temperature-compensated frequency selection code FTCFSEL such that the frequency of the clock signal CLK may be changed slowly based on the filtered temperature-compensated frequency selection code FTCFSEL.

To improve the effect of the operation temperature, conventional schemes use elements such as resistors, capacitors, etc. having opposite temperature characteristics or use complex analog circuits such as a band-gap reference circuit, etc. to provide uniform charging and discharging currents of the oscillator. However, the manufacturing process may not provide such element and analog circuits and the temperature compensation using mismatch of element may be not accurate.

According to some example embodiments, the problems due to effects of the operation temperature may be solved using the temperature compensation circuits of the present disclosure composed of relatively more simple logics. The temperature dependency of the oscillator may be compensated based on the output of the temperature sensor that is typically included in various products.

Figure 20:
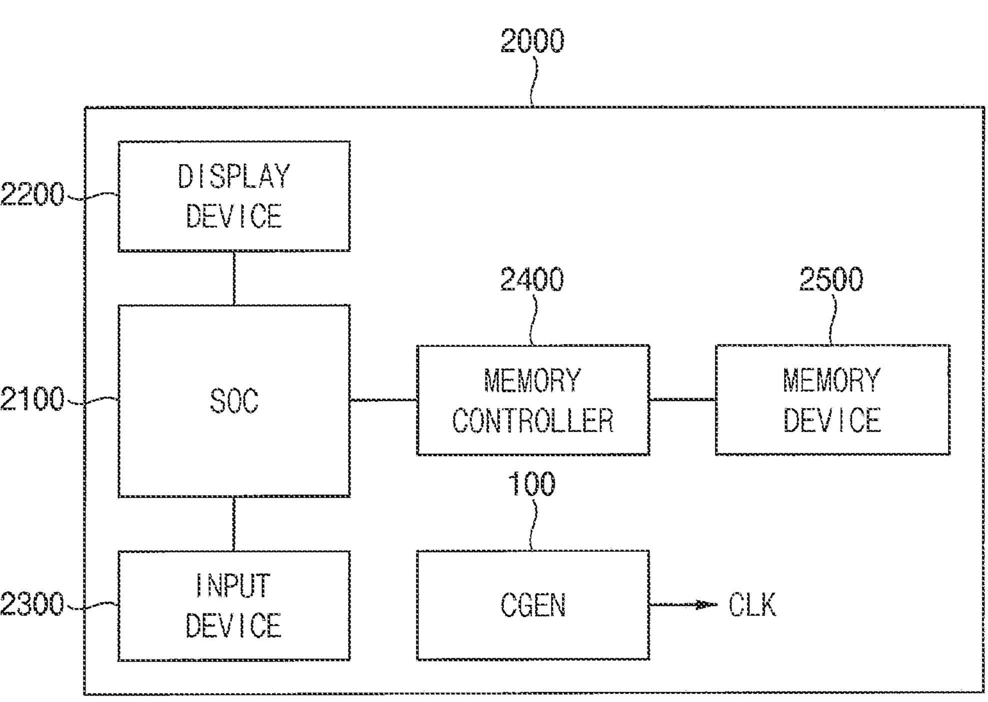
FIGS. 20 and 21 are block diagrams illustrating systems according to some example embodiments.
Figure 21:
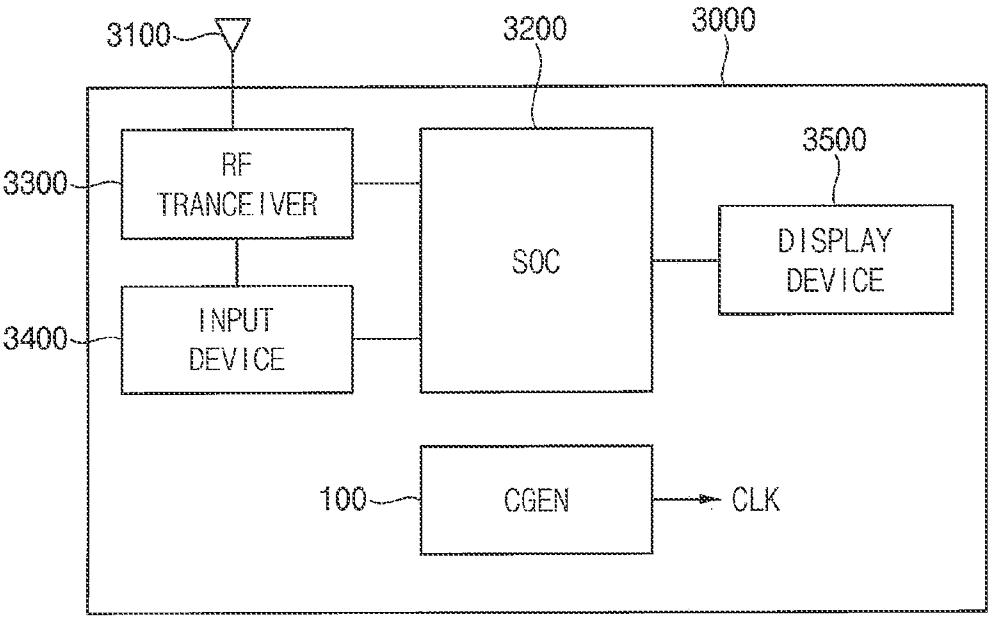

FIGS. 20 and 21 are block diagrams illustrating systems according to some example embodiments.

FIG. 20 illustrates a computer system 2000 that includes a system on chip (SOC) 2100, a display device 2200, an input device 2300, a memory controller 2400, a memory device 2500, and a clock generation circuit CGEN 100. The computing system 2000 may be implemented as a personal computer (PC), a network server, a tablet PC, a net-book, an e-reader, a personal digital assistant (PDA), a portable multimedia player (PMP), an MP3 player, an MP4 player, or the like.

The SOC 2100 may display data, stored in the memory device 2500 according to data input through the input device 2300, through the display device 2200. For example, the input device 2300 may be implemented as a pointing device, such as a touch pad or a computer mouse, a keypad, or a keyboard. The SOC 2100 may control overall operations of the computer system 2000 and control an operation of the memory controller 2400.

The memory controller 2400 may control the operation of the memory device 2500 and may be implemented as a portion of the SOC 2100 or a chip separated from the SOC 2100.

The clock generation circuit 100 according to some example embodiments may include a temperature compensation circuit and an oscillator. The temperature compensation circuit may be configured to generate a temperature-compensated frequency selection code that varies depending on an operation temperature, the temperature-compensated frequency selection code generated based on a difference between the operation temperature and a reference temperature and based on a temperature-independent frequency selection code that is fixed regardless of the operation temperature. The oscillator may be configured to generate a clock signal CLK that has an operation frequency that is based on the temperature-compensated frequency selection code, such that the operation frequency is uniform regardless of the operation temperature. The clock signal CLK may be used as an operation clock signal of at least one component of the computer system 2000.

FIG. 21 illustrates a computer system 3000 that includes an antenna 3100, an SOC 3200, a wireless transceiver such as a radio-frequency (RF) transceiver 3300, an input device 3400, a display device 3500 and a clock generation circuit CGEN 100.

The SOC 3200 may process an output signal from the RF transceiver 3100 and transfer the processed signal to the display device 3500. The input device 3400 may receive control signals to control the operation of the SOC 3200 and/or data processed by the SOC3200. The clock generation circuit 100 may include the temperature compensation circuit and the oscillator and may generate the clock signal CLK as described above. The clock signal CLK may be used as an operation clock signal of at least one component of the computer system 3000.

As described above, the clock generation circuits and methods of generating a clock signal, according to example embodiments, may reduce in an efficient manner effects of the operation temperature by generating the temperature-compensated frequency selection code that reflects the temperature characteristic of the oscillator using the output value of the temperature sensor and by controlling the oscillator using the temperature-compensated frequency selection code.

The inventive concepts may be applied to any electronic device and/or system that operate based on a clock signal. For example, the inventive concepts may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, an automotive driving system, or the like.

The foregoing is illustrative of some example embodiments and is not to be construed as limiting thereof. Although a few example embodiments have been described, those skilled in the art will readily appreciate that many modifications are possible in the example embodiments without materially departing from the present inventive concepts.

What is claimed is:

1. A clock generation circuit comprising:

a temperature compensation circuit configured to generate a temperature-compensated frequency selection code that varies depending on an operation temperature, the temperature-compensated frequency selection code generated based on a difference between the operation temperature and a reference temperature and based on a temperature-independent frequency selection code that is fixed regardless of the operation temperature, wherein the temperature compensation circuit is configured to generate the temperature-compensated frequency selection code according to a following equation, $$TCFSEL=(FSEL+\mathrm{LO})*WF*\Delta T+\mathrm{LO}$$

where TCFSEL indicates the temperature-compensated frequency selection code, FSEL indicates the temperature-independent frequency selection code, WF indicates a weight factor, ΔT indicates the difference between the operation temperature and the reference temperature, and LO indicates a constant value.

2. The clock generation circuit of claim 1, further comprising:

an oscillator configured to generate a clock signal having an operation frequency that is based on the temperature-compensated frequency selection code, such that the operation frequency is uniform regardless of the operation temperature.

3. The clock generation circuit of claim 1, wherein the weight factor is fixed regardless of the operation temperature.

4. The clock generation circuit of claim 1, wherein the weight factor includes a high-temperature weight factor that corresponds to the operation temperature being higher than the reference temperature and a low-temperature weight factor that corresponds to the operation temperature being lower than the operation temperature.

5. The clock generation circuit of claim 1, wherein the weight factor is varied depending on the operation temperature.

6. The clock generation circuit of claim 2, wherein the temperature compensation circuit is configured to reduce a value of the temperature-compensated frequency selection code as the operation temperature increases when the oscillator has proportional to absolute temperature (PTAT) characteristic, and wherein the temperature compensation circuit is configured to increase the value of the temperature-compensated frequency selection code as the operation temperature increases when the oscillator has complementary to absolute temperature (CTAT) characteristic.

7. The clock generation circuit of claim 2, wherein the oscillator is a resistor-capacitor (RC) oscillator, and wherein the oscillator is configured to generate a charging current that is proportional to the temperature-compensated frequency selection code and charge a capacitor using the charging current.

8. The clock generation circuit of claim 2, wherein the temperature compensation circuit is configured to perform low-pass filtering with respect to the temperature-compensated frequency selection code to provide a filtered temperature-compensated frequency selection code to the oscillator.

9. The clock generation circuit of claim 2, wherein the temperature compensation circuit is configured to output the temperature-compensated frequency selection code to the oscillator in a temperature compensation mode, and wherein the temperature compensation circuit is configured to output the temperature-independent frequency selection code in a normal mode.

10. The clock generation circuit of claim 7, further comprising:

a thermometer decoder configured to convert the temperature-compensated frequency selection code to a thermometer code, wherein the oscillator is configured to generate the charging current based on bit values of the thermometer code.

11. The clock generation circuit of claim 4, wherein the high-temperature weight factor and the low-temperature weight factor are determined according to following equations, $$WF\_HT=[(FSEL\_HT+LO)/(FSEL\_RT+LO)]/(HT-RT)$$

$$WF\_LT=[(FSEL\_ LT+LO)/(FSEL\_RT+LO)]/(RT-LT)$$

where WF_HT indicates the high-temperature weight factor, WF_LT indicates the low-temperature weight factor, RT indicates the reference temperature, HT indicates the operation temperature that is higher than the reference temperature, LT indicates the operation temperature that is lower than the reference temperature, FSEL_RT indicates a frequency selection code that corresponds the reference temperature, FSET_HT indicates a frequency selection code that corresponds to the operation temperature that is higher than the reference temperature, and FSEL_LT indicates a frequency selection code that corresponds to the operation temperature that is lower than the reference temperature.

12. A clock generation circuit comprising:

a temperature compensation circuit configured to generate a temperature-compensated frequency selection code that varies depending on an operation temperature, wherein the temperature compensation circuit includes:

a clock divider configured to generate a divided clock signal by dividing a frequency of a clock signal;

a logic circuit configured to generate a correction code based on a difference between the operation temperature and a reference temperature; and an output circuit configured to generate the temperature-compensated frequency selection code by summing the correction code and a temperature-independent frequency selection code that is fixed regardless of the operation temperature, wherein the temperature compensation circuit is configured to generate the temperature-compensated frequency selection code according to a following equation, $$TCFSEL=(FSEL+\mathrm{LO})*WF*\Delta T+\mathrm{LO}$$

where TCFSEL indicates the temperature-compensated frequency selection code, FSEL indicates the temperature-independent frequency selection code, WF indicates a weight factor, ΔT indicates the difference between the operation temperature and the reference temperature, and LO indicates a constant value.

13. The clock generation circuit of claim 12, wherein the logic circuit includes:

a first logic circuit configured to generate a temperature difference value that indicates a difference between a reference temperature code that corresponds to the reference temperature and an operation temperature code that corresponds to the operation temperature, the first logic circuit further configured to generate a polarity signal that indicates whether the operation temperature is higher than the reference temperature; and a second logic circuit configured to generate the correction code based on the temperature difference value, the polarity signal, and weight factor information provided from an external source.

14. The clock generation circuit of claim 13, wherein the temperature compensation circuit further includes:

a synchronization circuit configured to generate a synchronized external clock signal by synchronizing an external clock signal with the divided clock signal, the external clock signal being provided to the temperature compensation circuit in synchronization with the operation temperature code, and wherein the logic circuit is configured to receive the reference temperature code and the operation temperature code in synchronization with the synchronized external clock signal.

15. The clock generation circuit of claim 12, wherein the output circuit includes:

a first flip-flop including a data terminal configured to receive the correction code and a clock terminal receiving the divided clock signal;

a second flip-flop including a data terminal configured to receive an output of the first flip-flop and a clock terminal configured to receive the divided clock signal; and an adder configured to sum an output of the second flip-flop and the temperature-independent frequency selection code to output the temperature-compensated frequency selection code.

16. The clock generation circuit of claim 12, wherein the output circuit includes:

a low-pass filter configured to perform low-pass filtering with respect to the temperature-compensated frequency selection code to output a filtered temperature-compensated frequency selection code.

17. The clock generation circuit of claim 12, wherein the output circuit includes:

a selector configured to output the temperature-compensated frequency selection code in a temperature compensation mode and configured to output the temperature-independent frequency selection code in a normal mode, based on a mode signal indicating the temperature compensation mode or the normal mode.

18. The clock generation circuit of claim 12, further comprising:

an oscillator configured to generate the clock signal having an operation frequency that is based on the temperature-compensated frequency selection code, such that the operation frequency is uniform regardless of the operation temperature, wherein the temperature compensation circuit further incudes:

a start-up enable circuit configured to generate a compensated reset signal by synchronizing a voltage reset signal with the divided clock signal, the voltage reset signal indicating a power-up timing of a regulator voltage that is applied to the oscillator, and wherein the oscillator is enabled in response to the compensated reset signal.

19. The clock generation circuit of claim 18, wherein the start-up enable circuit includes:

a first flip-flop including a data terminal configured to receive a voltage corresponding to a logic high level and a clock terminal configured to receive the divided clock signal;

an inverter configured to generate an inverted-divided clock signal by inverting the divided clock signal;

a second flip-flop including a data terminal configured to receive an output of the first flip-flop and a clock terminal configured to receive the inverted-divided clock signal; an XOR gate configured to perform an XOR logic operation on the output of the first flip-flop and an output of the second flip-flop; and an AND gate configured to perform an AND operation on an output of the XOR gate and the voltage reset signal to generate the compensated reset signal.

20. A temperature compensation circuit comprising:

a clock divider configured to generate a divided clock signal by dividing a frequency of a clock signal;

a logic circuit configured to generate a correction code based on a difference between an operation temperature and a reference temperature; and an output circuit configured to generate a temperature-compensated frequency selection code by summing the correction code and a temperature-independent frequency selection code that is fixed regardless of the operation temperature, wherein the temperature compensation circuit is configured to generate the temperature-compensated frequency selection code according to a following equation, $$TCFSEL=(FSEL+\mathrm{LO})*WF*\Delta T+\mathrm{LO}$$

where TCFSEL indicates the temperature-compensated frequency selection code, FSEL indicates the temperature-independent frequency selection code, WF indicates a weight factor, ΔT indicates the difference between the operation temperature and the reference temperature, and LO indicates a constant value.

* * * * *